US012690458B2

(12) United States Patent
Chen

(10) Patent No.: US 12,690,458 B2
(45) Date of Patent: ***Jul. 21, 2026

(54) IC PACKAGE WITH VERY THIN VAPOR CHAMBER FOR HEAT DISSIPATION

(71) Applicants:Wei-Lin Chen, New Taipei City (TW); Ming-Yuan Kang, New Taipei City (TW)

(72) Inventor: Wei-Lin Chen, New Taipei City (TW)

(73) Assignees: Wei-Lin Chen, New Taipei City (TW); Ming-Yuan Kang, New Taipei City (TW)

( * ) Notice: Subject to any disclaimer, the term of this patent is extended or adjusted under 35 U.S.C. 154(b) by 371 days.

This patent is subject to a terminal disclaimer.

(21) Appl. No.: 18/223,741

(22) Filed: Jul. 19, 2023

(65) Prior Publication Data

US 2024/0030097 A1     Jan. 25, 2024

Related U.S. Application Data

(60) Provisional application No. 63/390,736, filed on Jul. 20, 2022.

(51) Int. Cl.
    *H10W 40/73*     (2026.01)
    *H10W 40/77*     (2026.01)
    *H10W 74/10*     (2026.01)

(52) U.S. Cl.
    CPC ......... *H10W 40/73* (2026.01); *H10W 40/778* (2026.01); *H10W 74/127* (2026.01)

(58) Field of Classification Search
    CPC ....... H05K 1/0203–0204; H05K 1/181; H05K 7/023; H05K 7/20; H05K 7/1489; H05K 7/20254; H05K 7/20281; H05K 7/20454; H05K 7/20509; H05K 2201/064; H05K 2201/066; H01L 23/34; H01L 23/367;
(Continued)

(56) References Cited

U.S. PATENT DOCUMENTS

| | | | | |
|---|---|---|---|---|
| 5,216,580 A | * | 6/1993 | Davidson | .............. H01L 23/427 174/15.2 |
| 10,985,085 B2 | * | 4/2021 | Hu | ......................... H10W 40/73 |

(Continued)

FOREIGN PATENT DOCUMENTS

| | | | | | |
|---|---|---|---|---|---|
| CN | 105764300 A | * | 7/2016 | ........... | F28D 15/046 |
| TW | 200536083 A | | 11/2005 | | |

OTHER PUBLICATIONS

CN-105764300-A English Translation (Year: 2016).*
Notice of Office Action issued by Taiwan Intellectual Property Office on Jul. 23, 2024.

*Primary Examiner* — Amir A Jalali
(74) *Attorney, Agent, or Firm* — WPAT, PC

(57)     ABSTRACT

An IC package comprises a substrate; a semiconductor die with a top surface, wherein the semiconductor die is stacked over the substrate; a vapor chamber stacked over the semiconductor die, wherein the vapor chamber comprises a proximal portion and a distal portion, the proximal portion covers the top surface of the semiconductor die; and an encapsulating case encapsulating the substrate, the semiconductor die and the vapor chamber, wherein the proximal portion of the vapor chamber is within the encapsulating case, and the distal portion of the vapor chamber extends from a wall of the encapsulating case.

19 Claims, 17 Drawing Sheets

(58) Field of Classification Search
  CPC ... H01L 23/3736; H01L 23/40; H01L 23/427;
      H01L 23/473; H01L 2225/06589; H01L
      21/4882; H01L 24/29; H01L 24/32; H01L
      24/33; H01L 25/0655; G06F 1/20; G06F
      2200/201; F28D 1/0443
  See application file for complete search history.

(56) References Cited

U.S. PATENT DOCUMENTS

| | | | |
|---|---|---|---|
| 11,497,119 B2 * | 11/2022 | Ingelhag | H01L 23/49822 |
| 2004/0037043 A1 | 2/2004 | Ku | |
| 2004/0099945 A1 | 5/2004 | Ku | |
| 2005/0280162 A1 * | 12/2005 | Mok | H01L 23/427 |
| | | | 257/E23.088 |
| 2007/0108564 A1 | 5/2007 | Tang et al. | |
| 2011/0024892 A1 * | 2/2011 | Lin | H01L 23/427 |
| | | | 257/E23.098 |
| 2013/0223010 A1 * | 8/2013 | Shioga | H10W 40/00 |
| | | | 438/122 |
| 2017/0358556 A1 * | 12/2017 | Bitz | H10W 40/70 |
| 2020/0091036 A1 * | 3/2020 | Chen | H01L 24/32 |
| 2020/0132392 A1 * | 4/2020 | Joshi | H05K 7/2039 |
| 2021/0018272 A1 * | 1/2021 | Inagaki | F28D 15/0233 |
| 2021/0233833 A1 * | 7/2021 | Ku | H01L 25/0655 |
| 2021/0400825 A1 * | 12/2021 | Sugiyama | F28D 15/0275 |
| 2023/0290706 A1 * | 9/2023 | Patankar | H01L 23/473 |

* cited by examiner $d2>d1$, wherein $d2< 2.5mm$; $C>10~20d2$

IC PACKAGE WITH VERY THIN VAPOR CHAMBER FOR HEAT DISSIPATION

BACKGROUND OF THE INVENTION

1. Field of the Invention

The present invention relates to an IC package with heat dissipation structure, and particularly to a high performance computing IC package with very thin vapor chamber for heat dissipation.

2. Description of the Prior Art

Nowadays, electronic devices (such as, smart-phones and notebook) have been widely used, and these electronic devices may include various components to provide a variety of functions. For example, the notebook may include a graphic processing unit (GPU) IC to provide a graphical user interface (GUI) through a display module. In addition, the notebook may include a communication processor IC to communicate with other electronic devices and central processing unit (CPU) IC to calculate and handle data. Moreover, high volume storage memory ICs are also required in the notebook to store the data. Nevertheless, a typical problem for those ICs is heat dissipation during operation. A prolonged exposure of an IC by operating at excessive temperatures may decrease the reliability and operating lifetime of the IC.

For high performance computing (HPC) requirement, those IC dies (including CPU, GPU, and/or memory ICs such as HBM) will be stacked together and encapsulated within a casing or package in a form of 2.5D IC structure or 3D IC structure. The heat dissipation problem may become severe for those 2.5D IC structure or 3D IC structure. In 3D IC structure or 2.5D IC structure, multiple heat sources present along the heat flow paths in stacked chips may create localized hot spots which exceed the allowable junction temperatures of those ICs. For example, some high performance 3D IC chip or 2.5D IC chip may be burned out during high frequency operation due to the heat generated more than 1000 W.

To be worse, the aforementioned ICs may generate electromagnetic waves, and the electromagnetic waves generated by those ICs may cause a malfunction of the electronic device. Furthermore, the electromagnetic waves generated by the components may have a harmful influence on a human body. Accordingly, a shield-can needs to be disposed on the components to shield the electromagnetic waves. The shield-can may shield the electromagnetic waves generated by the components. However, the conventional shield-can may not be an efficient heat conductor and make the heat dissipation in those shielded ICs worse.

SUMMARY OF THE INVENTION

An embodiment of the present invention provides an IC package. An IC package comprises a substrate; a semiconductor die with a top surface, wherein the semiconductor die is stacked over the substrate; a vapor chamber stacked over the semiconductor die, wherein the vapor chamber comprises a proximal portion and a distal portion, the proximal portion covers the top surface of the semiconductor die; and an encapsulating case encapsulating the substrate, the semiconductor die and the vapor chamber, wherein the proximal portion of the vapor chamber is within the encapsulating case, and the distal portion of the vapor chamber extends from a wall of the encapsulating case.

According to one aspect of the present invention, the vapor chamber is a very thin vapor chamber with a thickness of 0.3 mm~0.6 mm.

According to one aspect of the present invention, the vapor chamber is a very thin vapor chamber with a thickness less than 1 mm, the proximal portion of the vapor chamber is sealed within the encapsulating case, and the distal portion of the vapor chamber is not sealed within the encapsulating case.

According to one aspect of the present invention, the encapsulating case is made of molding compound material, the proximal portion of the vapor chamber is sealed by the molding compound material, and there is no molding compound material between the vapor chamber and the semiconductor die.

According to one aspect of the present invention, the encapsulating case is a metal or mechanical case encapsulating the substrate, the semiconductor die and the vapor chamber, and the wall of the metal or mechanical case from which the distal portion of the vapor chamber extends out of is melt together with the vapor chamber, or sealed with anti-water material.

According to one aspect of the present invention, the proximal portion covers most or all the top surface of the semiconductor die, and the vapor chamber is stacked over the semiconductor die through a TIM or thermal adhesive layer.

According to one aspect of the present invention, a supporting pillar is between the vapor chamber and the substrate, and a height of the supporting pillar is larger than that of the semiconductor die.

According to one aspect of the present invention, the vapor comprises a set of isolating structures formed in the vapor chamber, and a capillary structure formed in the vapor chamber and between the set of isolating structures.

According to one aspect of the present invention, the set of isolating structures extend along the direction from the distal portion to the proximal portion, and the set of isolating structures penetrates through the wall of the encapsulating case.

According to one aspect of the present invention, the vapor chamber further comprises a set of supporting structures in the vapor chamber and connected to the set of isolating structures, wherein the set of supporting structure extend downward from a top side of the vapor chamber and the set of isolating structures extend upward from a bottom side of the vapor chamber, and another capillary structure is disposed between the set of supporting structure.

According to one aspect of the present invention, the distal portion of the vapor chamber is thermally coupled to a heat sink, or is directly coupled to a liquid.

Another embodiment of the present invention provides an IC package. The IC package includes a substrate; a first semiconductor chip with a first top surface, the first semiconductor die stacked over the substrate; a first vapor chamber stacked over the first semiconductor die, wherein the first vapor chamber comprises a first proximal portion and a first distal portion, the proximal portion covers the first top surface of the first semiconductor chip, and a thickness of the first proximal portion is less than 1 mm; and an encapsulating case encapsulating the substrate, the first semiconductor chip and the first vapor chamber, wherein the first proximal portion of the first vapor chamber is sealed within the encapsulating case, and the first distal portion of the first vapor chamber protrudes from a wall of the encapsulating case.

According to one aspect of the present invention, a thickness of the first distal portion is larger than the thickness of the proximal portion which is between 0.2 mm~0.8 mm.

According to one aspect of the present invention, the first vapor chamber further comprises another distal portion protruding from another wall of the encapsulating case, and the first proximal portion is between the distal portion and the another distal portion.

According to one aspect of the present invention, both a width of the distal portion and a width of the another distal portion are greater than a width of the proximal portion.

According to one aspect of the present invention, the IC package further comprises a second vapor chamber physically spaced apart from the first vapor chamber and stacked over the first semiconductor chip, wherein the second vapor chamber is encapsulated by the encapsulating case; wherein the second vapor chamber comprises a second proximal portion and a second distal portion, the second proximal portion of the second vapor chamber covers the first top surface of the first semiconductor chip, and a thickness of the second proximal portion of the second vapor chamber is less than 1 mm, and the second distal portion of the second vapor chamber protrudes from another wall of the encapsulating case.

According to one aspect of the present invention, the IC package further comprises a second semiconductor chip vertically spaced apart from the first semiconductor die, the second semiconductor die disposed between the first semiconductor chip and the substrate.

According to one aspect of the present invention, the IC package further comprises a second semiconductor chip with a second top surface, the second semiconductor chip horizontally spaced apart from the first semiconductor chip and stacked over the substrate; and a second vapor chamber horizontally spaced apart from the first vapor chamber and stacked over the second semiconductor chip, wherein the second semiconductor chip and the second vapor chamber is encapsulated by the encapsulating case; wherein the second vapor chamber comprises a second proximal portion and a second distal portion, the second proximal portion of the second vapor chamber covers the second top surface of the second semiconductor chip, and a thickness of the second proximal portion of the second vapor chamber is less than 1 mm, and the second distal portion of the second vapor chamber protrudes from another wall of the encapsulating case.

According to one aspect of the present invention, the second semiconductor chip comprises a set of semiconductor sub-dies vertically stacked together, a thickness of the second semiconductor chip is larger than that of the first semiconductor chip, and a thickness of the proximal portion of the second vapor chamber is less than that of the proximal portion of the first vapor chamber.

Another embodiment of the present invention provides an IC package. The IC package comprises a substrate; a first semiconductor IC with a first top surface, the first semiconductor IC stacked above the substrate; a first vapor chamber stacked above the first semiconductor IC, wherein the first vapor chamber comprises a first proximal portion and a first distal portion, the first proximal portion covers the top surface of the first semiconductor IC; and an encapsulating case encapsulating the first semiconductor IC and the first vapor chamber, wherein the first proximal portion of the first vapor chamber is encapsulated within the encapsulating case, and the first distal portion of the first vapor chamber reveals or protrude from the encapsulating case; wherein the first distal portion of the first vapor chamber is thermally coupled to a heat sink, or is immersed into a liquid.

According to one aspect of the present invention, the encapsulating case is a metal case encapsulating the first semiconductor IC and the first vapor chamber, the first vapor chamber further comprises a transition portion between the proximal portion and the distal portion, and the transition portion is melt with the metal case, or the transition portion and the metal case are sealed by an anti-water material.

According to one aspect of the present invention, the IC package further comprises a second semiconductor IC with a second top surface, the second semiconductor IC physically spaced apart from the first semiconductor die and stacked over the substrate; and a second vapor chamber horizontally spaced apart from the first vapor chamber and stacked over the second semiconductor IC, wherein the second semiconductor IC and the second vapor chamber is encapsulated by the encapsulating case; wherein the second vapor chamber comprises a second proximal portion and a second distal portion, the second proximal portion of the second vapor chamber covers the second top surface of the second semiconductor IC, and the second distal portion of the second vapor chamber reveals from the encapsulating case.

According to one aspect of the present invention, the IC package further comprises a second semiconductor IC with a second top surface, the second semiconductor IC horizontally spaced apart from the first semiconductor IC and stacked above the substrate, wherein the second semiconductor IC is encapsulated by the encapsulating case; wherein the first vapor chamber further comprises another proximal portion covering the second top surface of the second semiconductor IC, and a distance between the first distal portion and first the proximal portion is different from a distance between the second distal portion and the another proximal portion.

BRIEF DESCRIPTION OF THE APPENDED DRAWINGS

Figure 2:
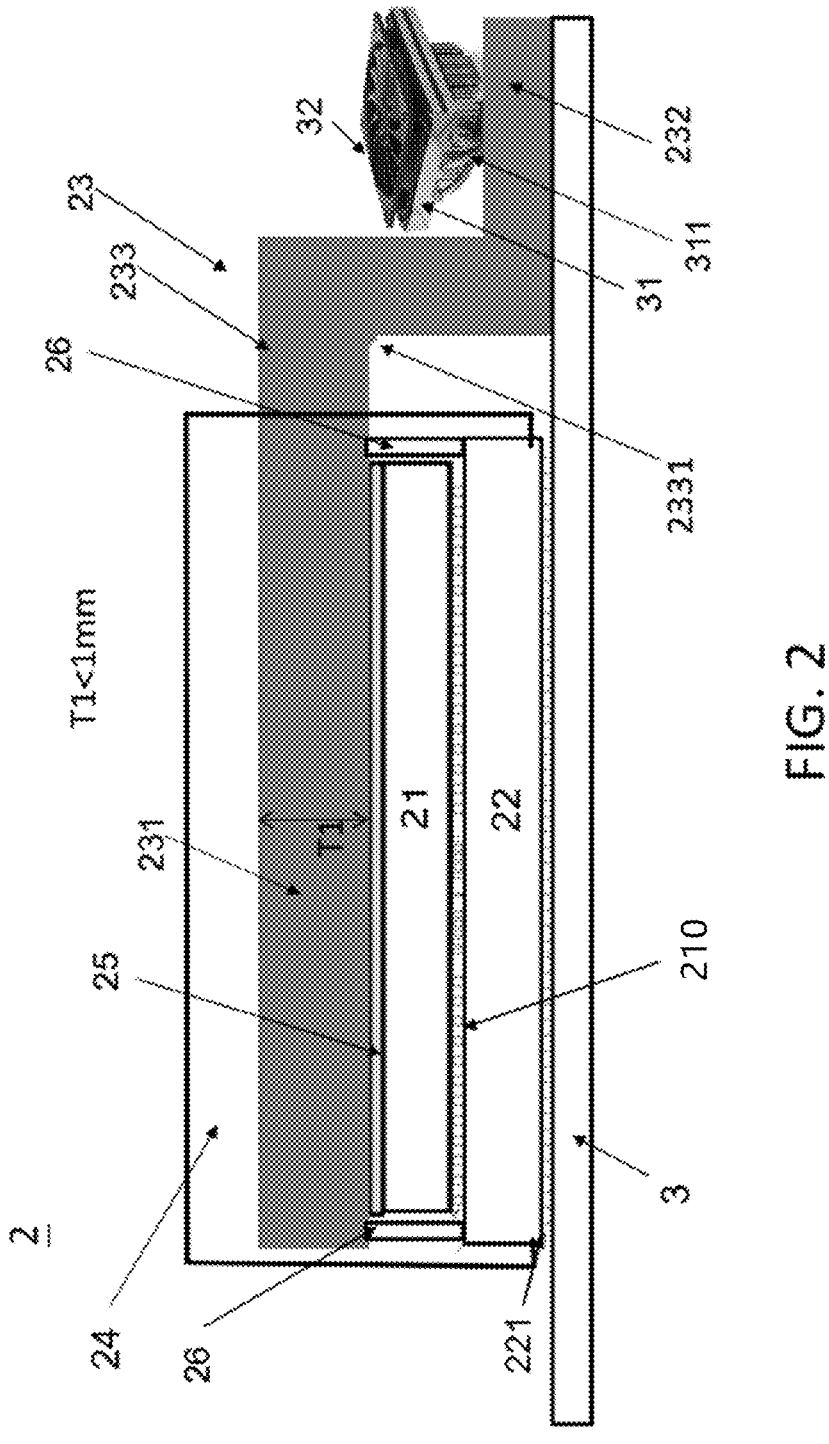
FIG. 2 is a diagram illustrating one embodiment of IC package according to the present invention.
Figures 3A, 3B:
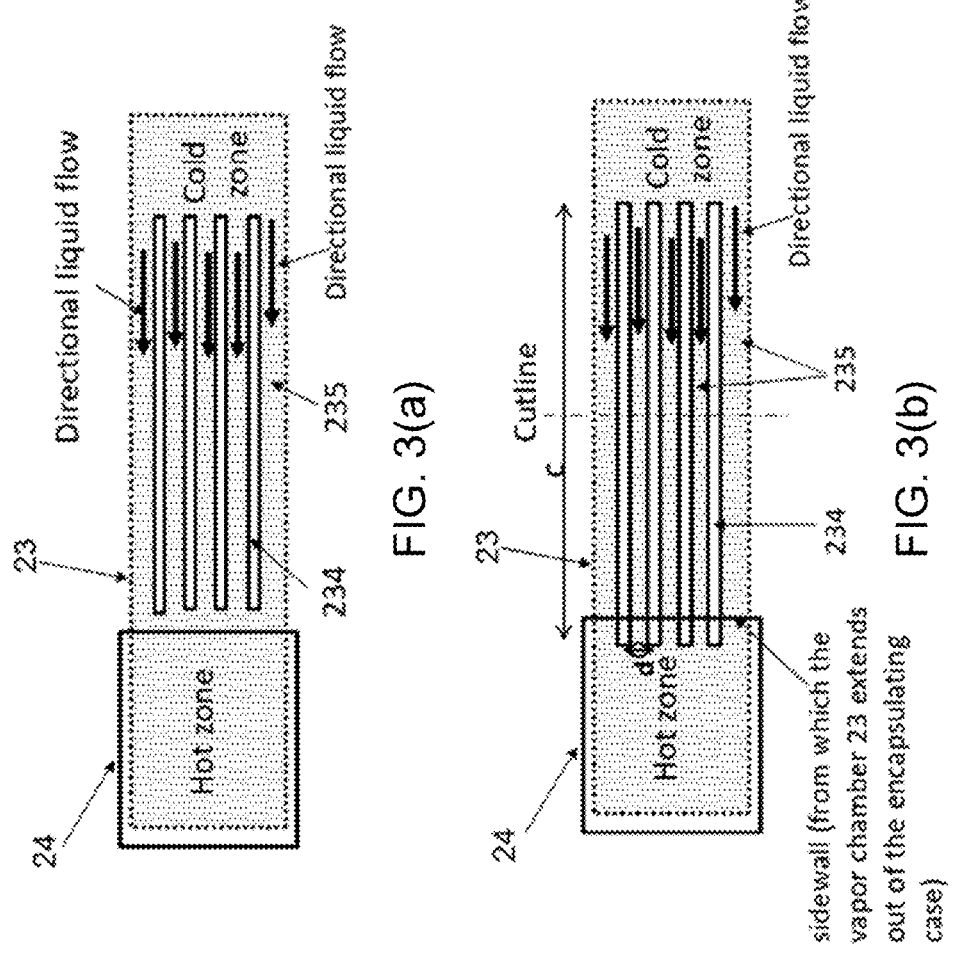

FIG. 3(a) and FIG. 3(b) illustrate exemplary top and transparent views of the IC package in FIG. 2.

Figures 1A, 1B, 3:
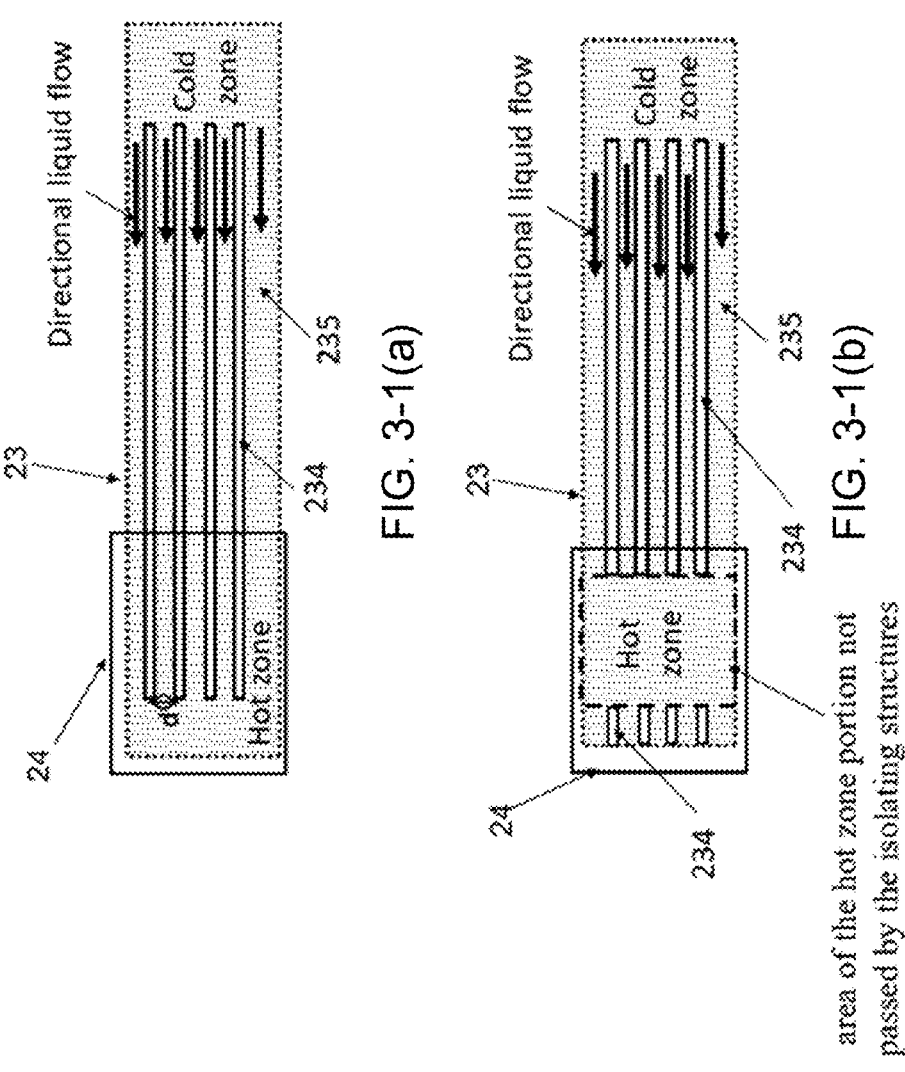

FIG. 3-1(a) and FIG. 3-1(b) illustrate another exemplary top and transparent views of the IC package in FIG. 2.

Figure 2A:
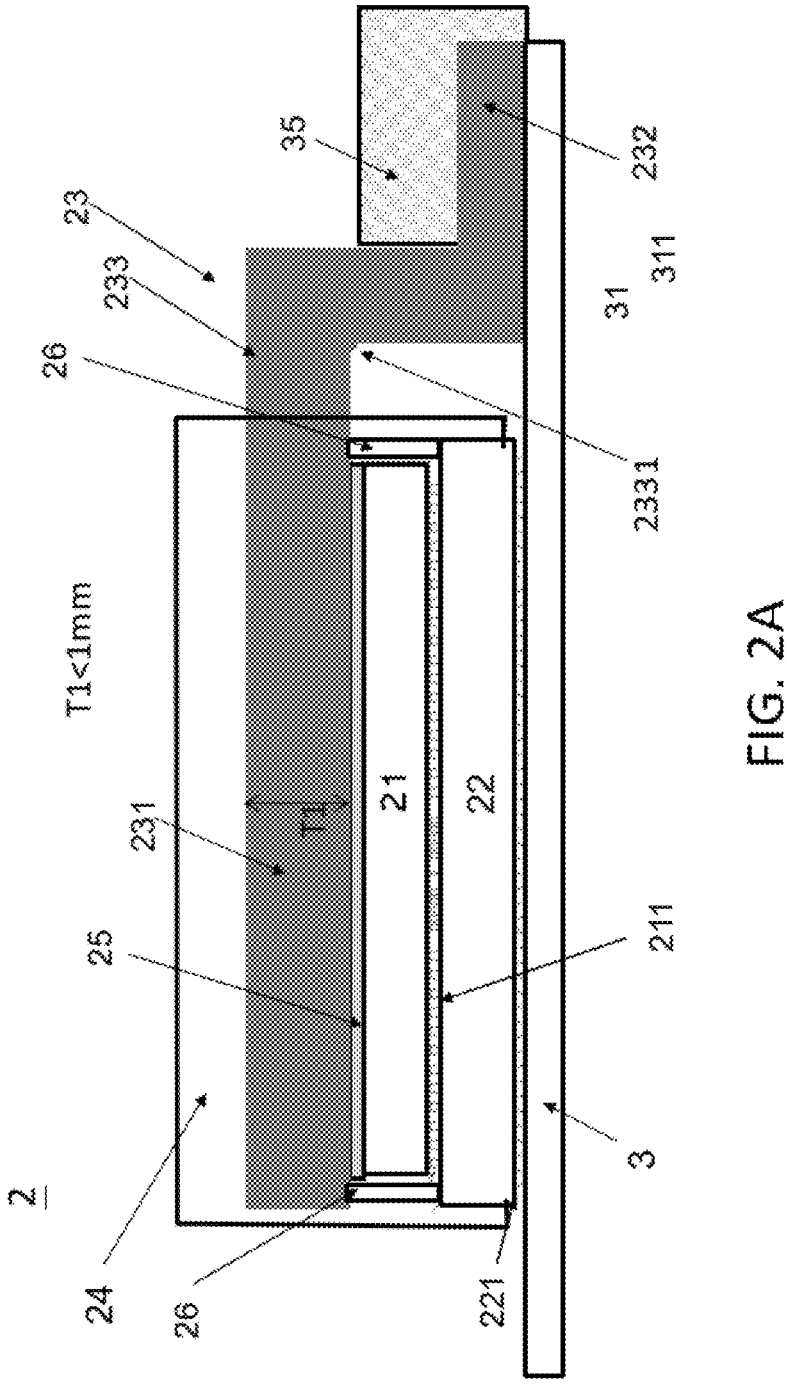
FIG. 2A is a diagram illustrating another embodiment of IC package according to the present invention.
Figures 2A, 2B, 3:
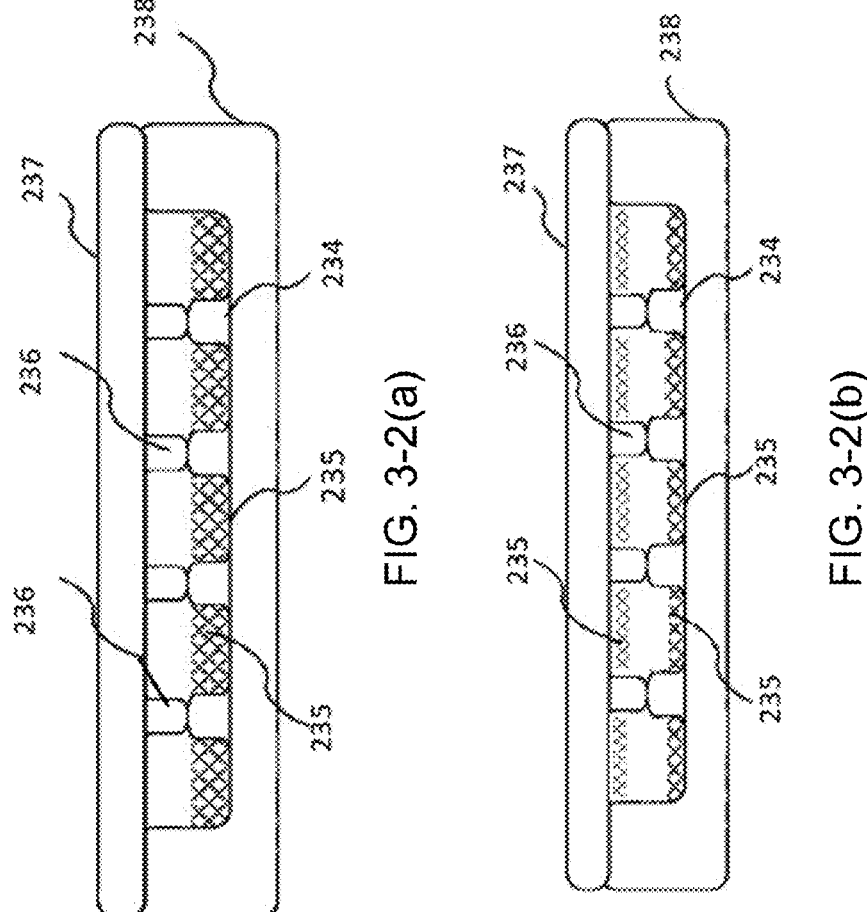

FIG. 3-2(a) and FIG. 3-2(b) illustrate exemplary cross section views of the vapor chamber along the cutline shown in FIG. 3(b).

Figure 4:
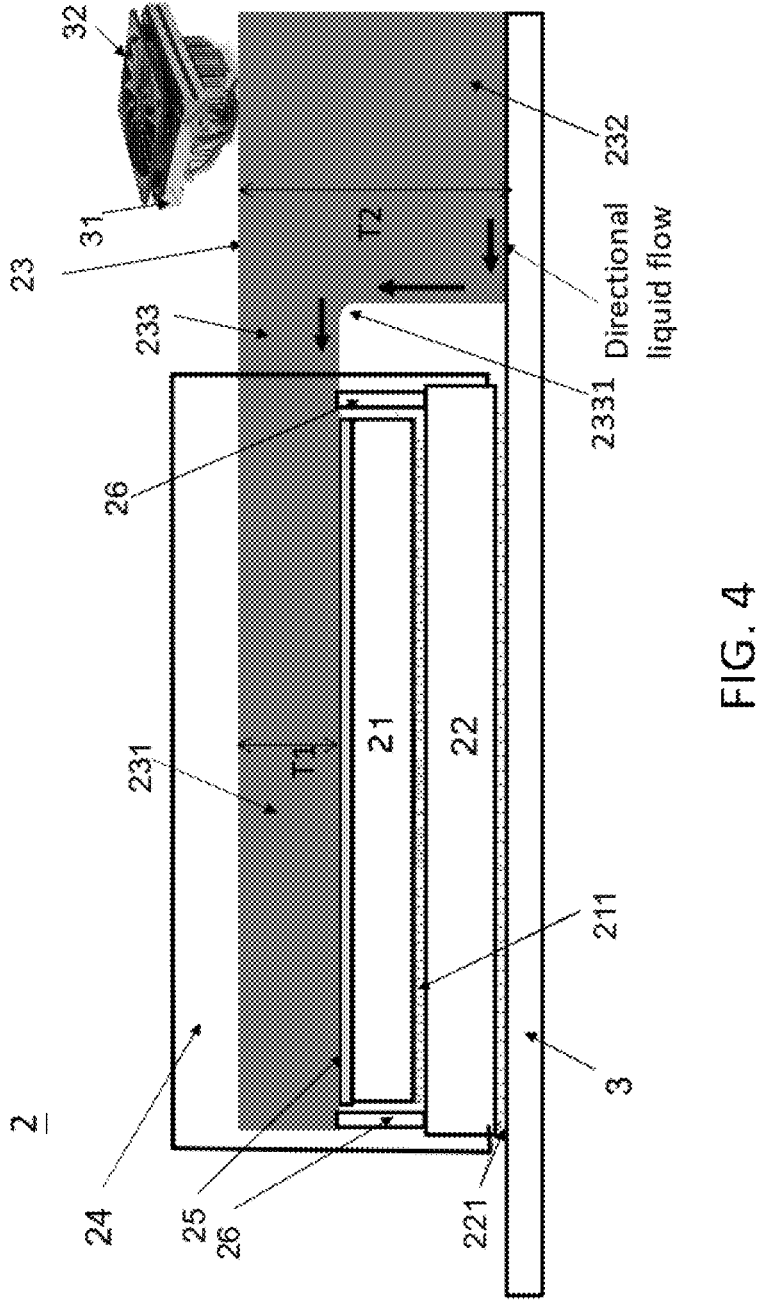

FIG. 4 is a diagram illustrating another embodiment of IC package according to the present invention.

Figure 5:
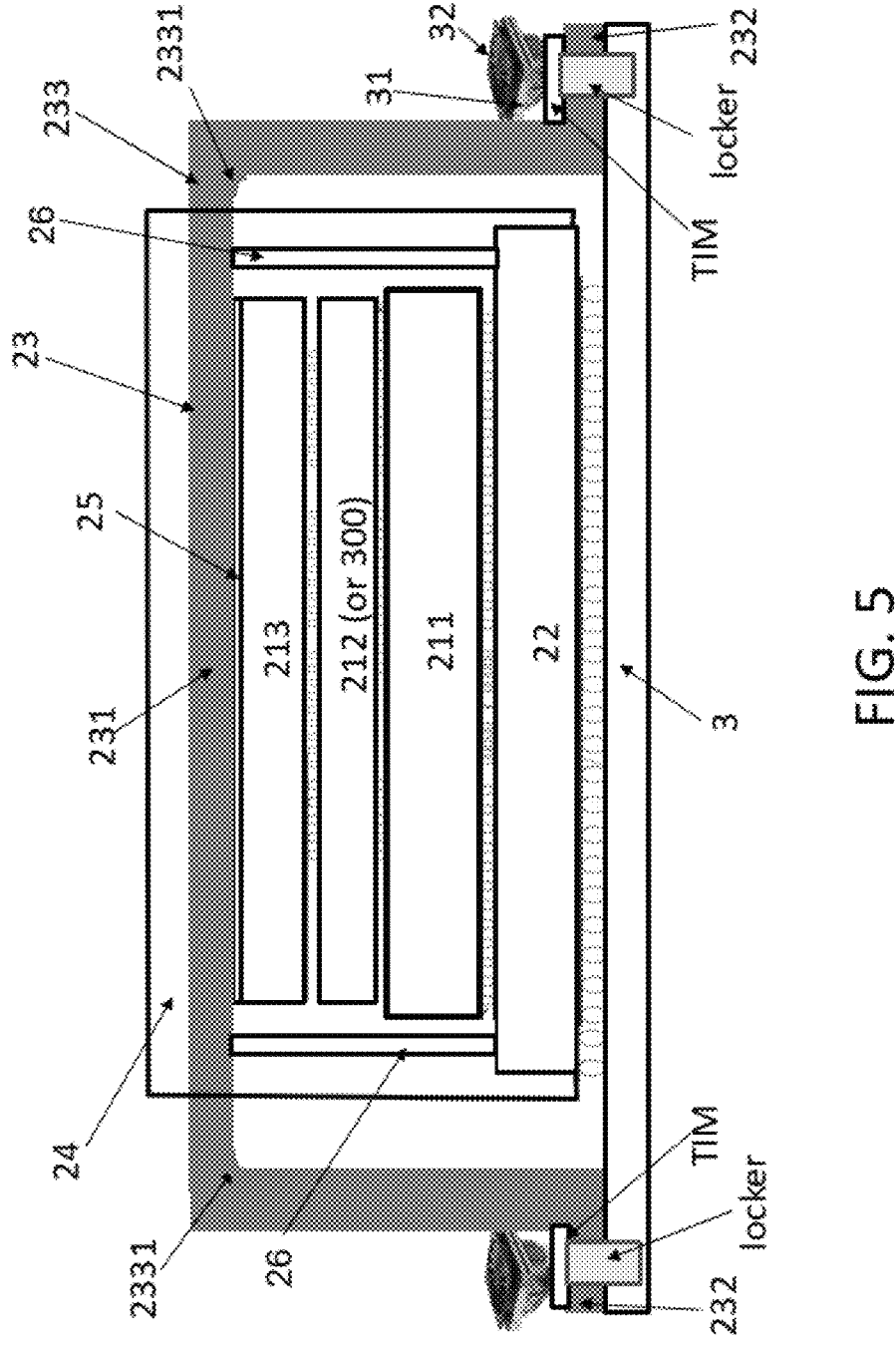

FIG. 5 is a diagram illustrating another embodiment of IC package according to the present invention.

Figure 6:
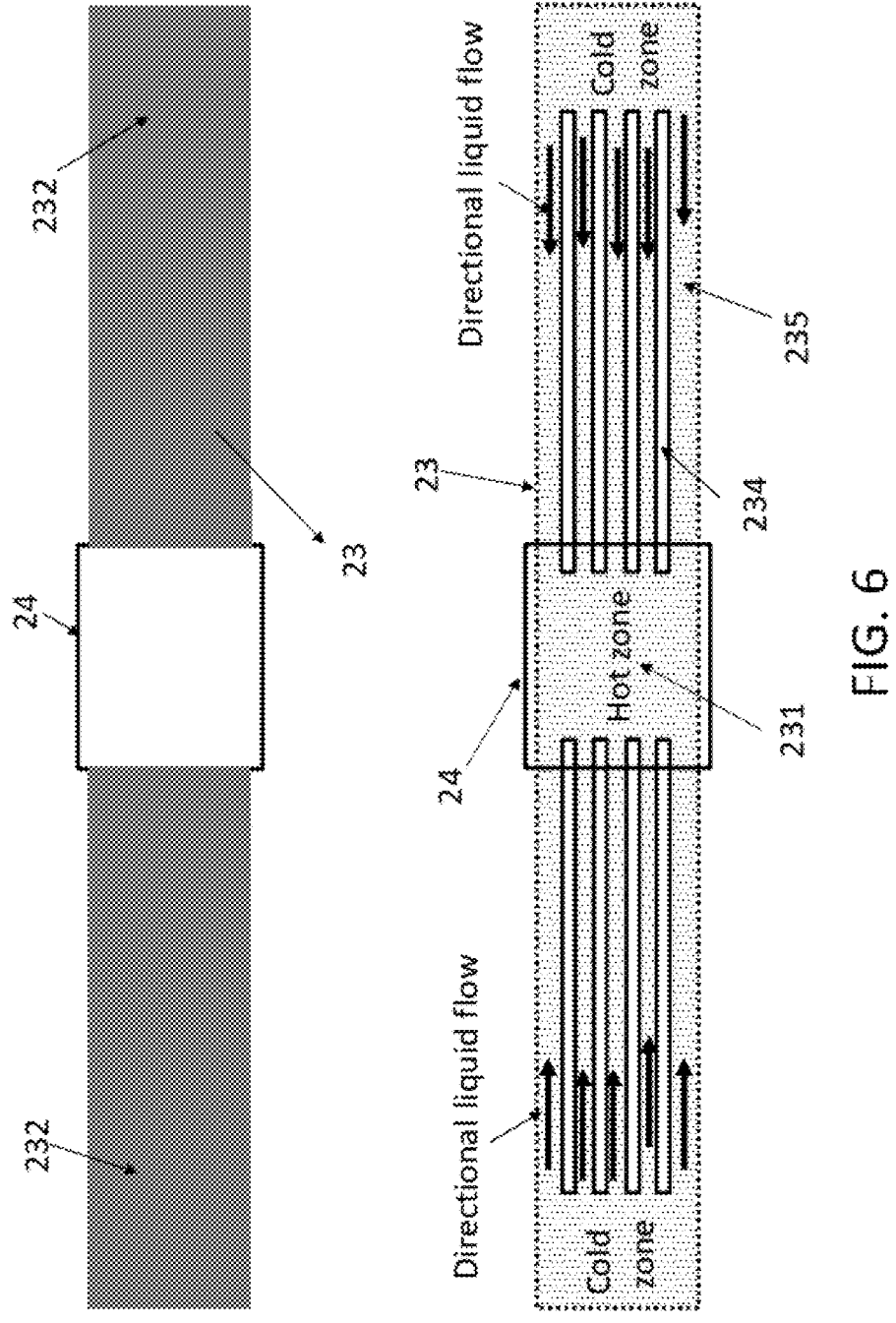

FIG. 6 illustrates one exemplary top and transparent view of the IC package in FIG. 5.

Figure 7:
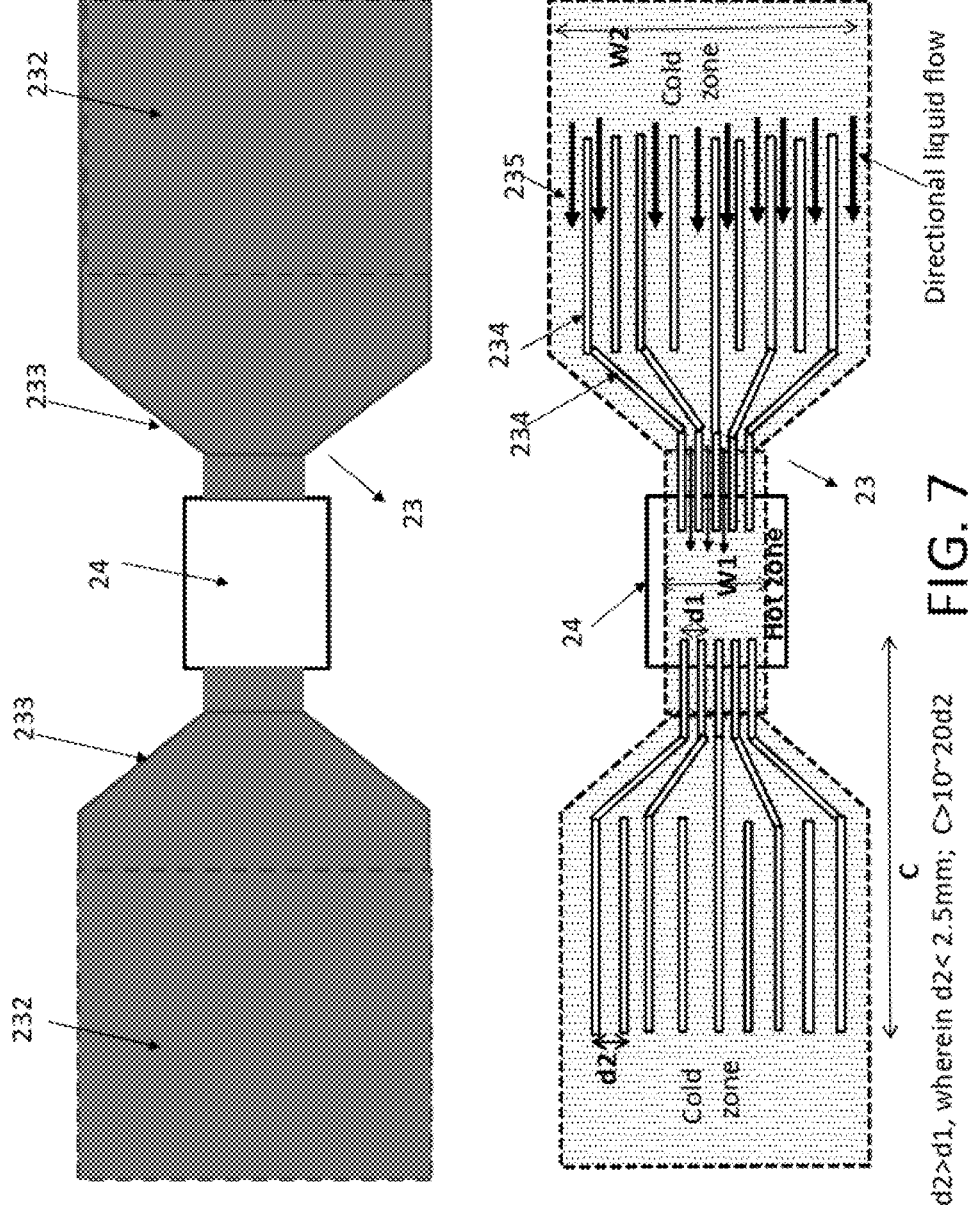

FIG. 7 illustrates another exemplary top and transparent view of the IC package in FIG. 5.

Figure 8:
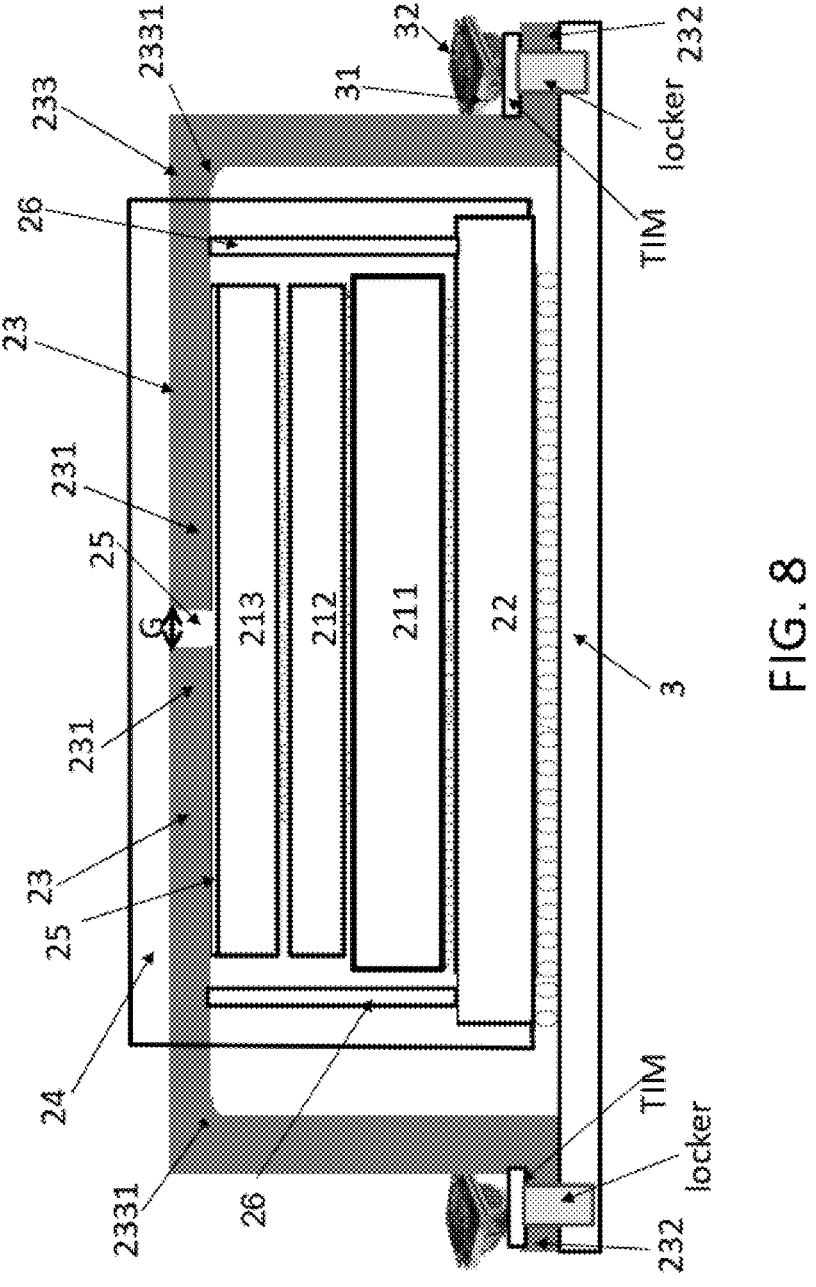

FIG. 8 is a diagram illustrating another embodiment of IC package according to the present invention.

Figure 9:
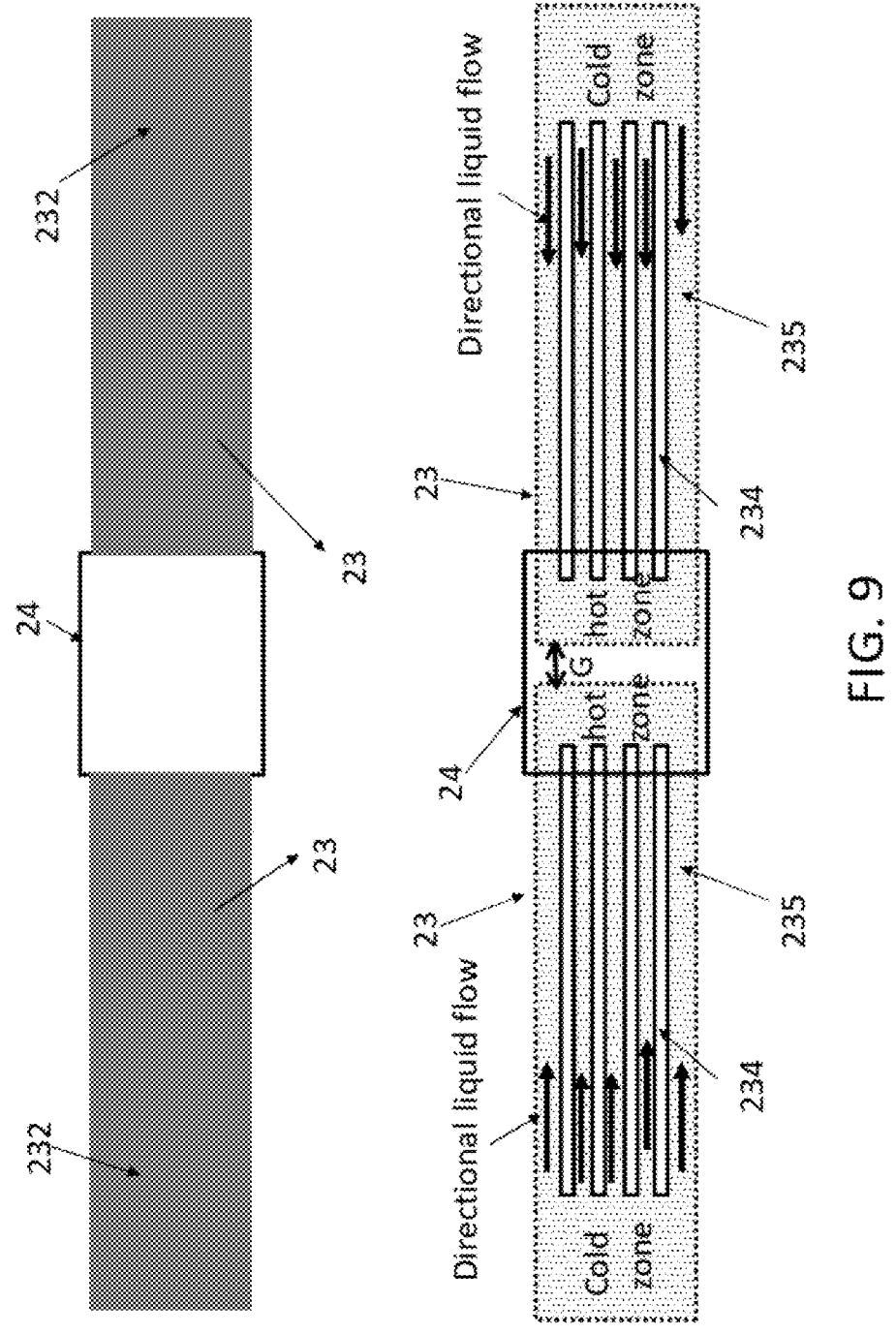

FIG. 9 illustrates one exemplary top and transparent view of the IC package in FIG. 8.

Figure 10:
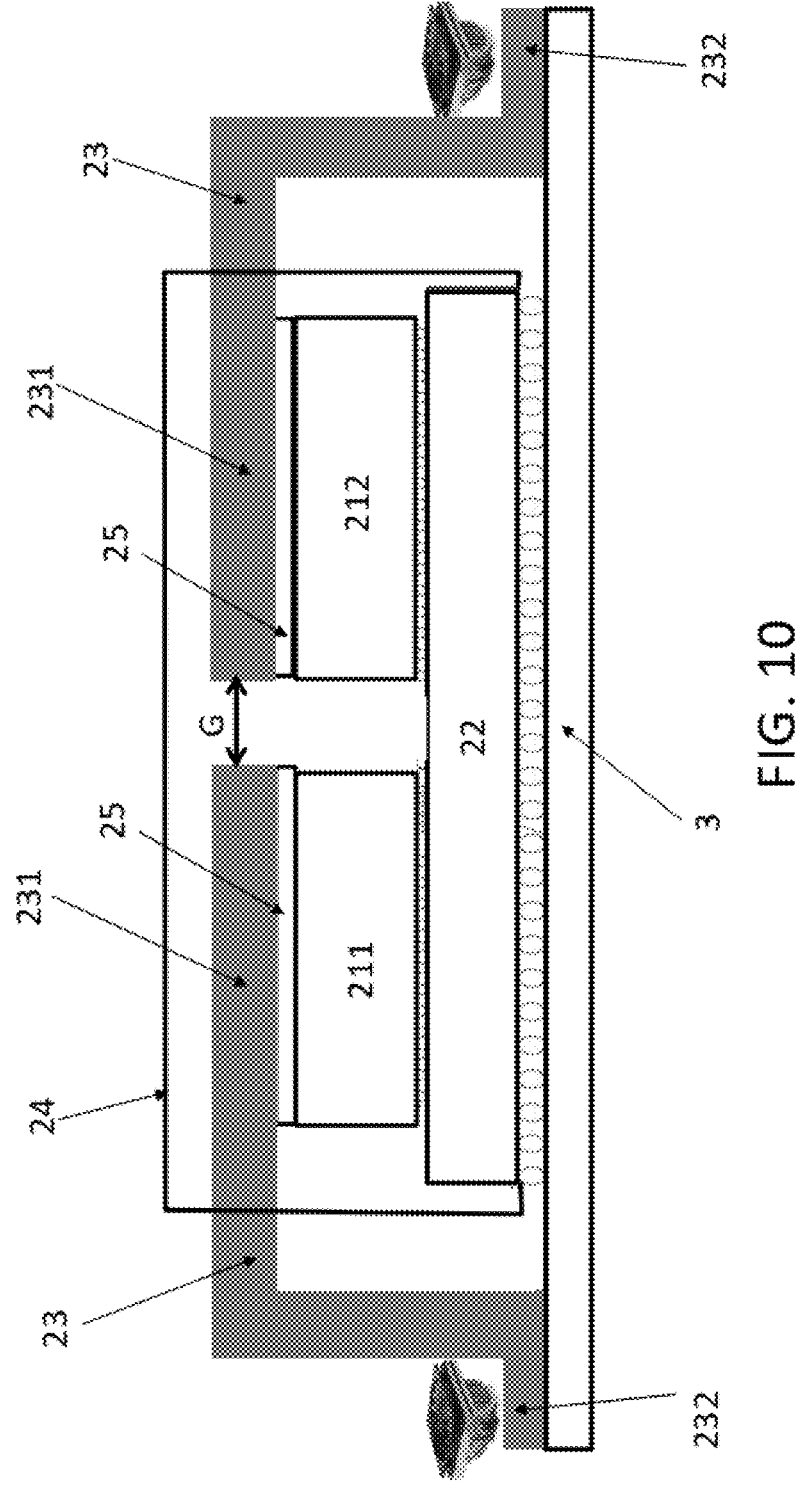

FIG. 10 is a diagram illustrating another embodiment of IC package according to the present invention.

Figure 11:
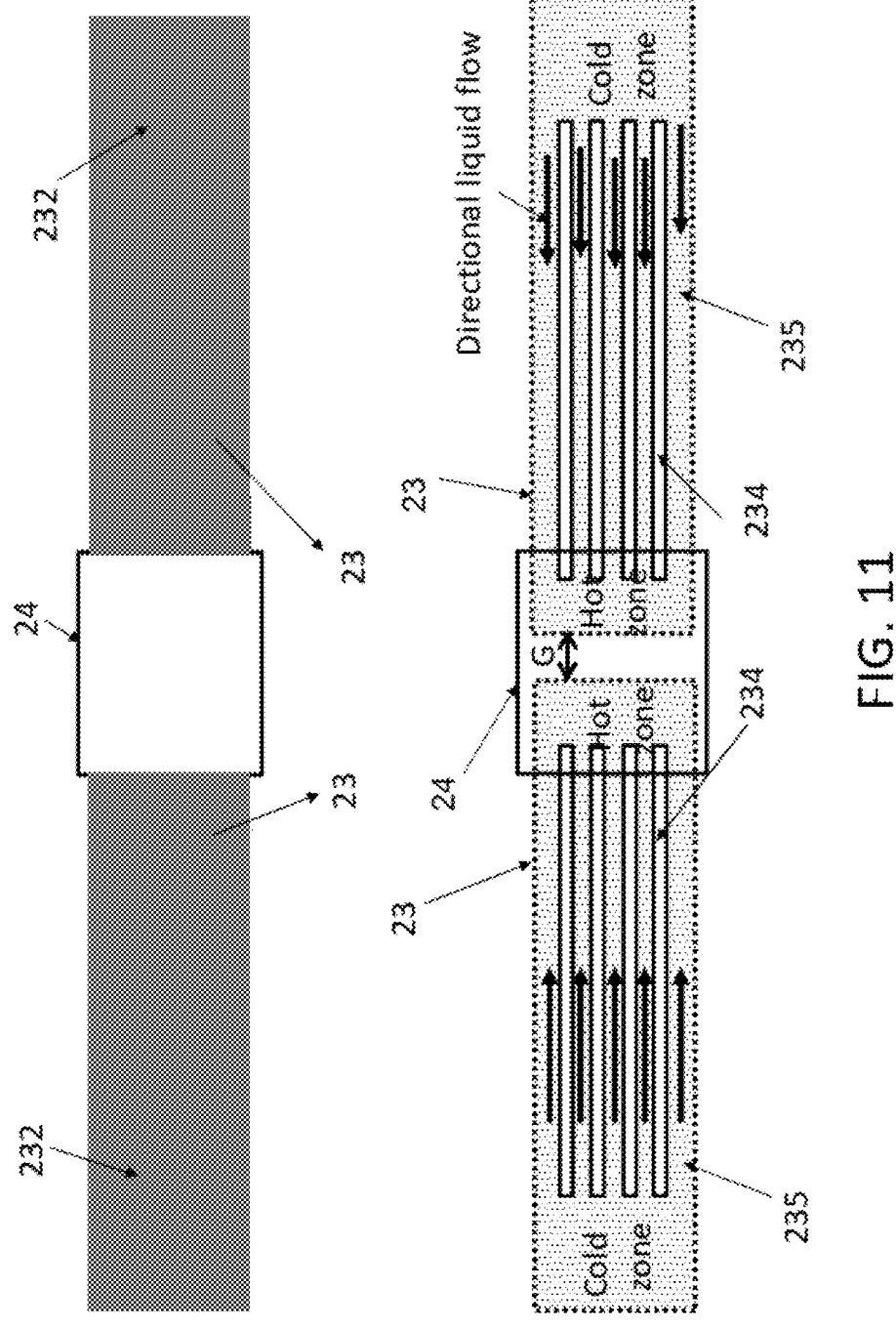

FIG. 11 illustrates one exemplary top and transparent view of the IC package in FIG. 10.

Figure 12:
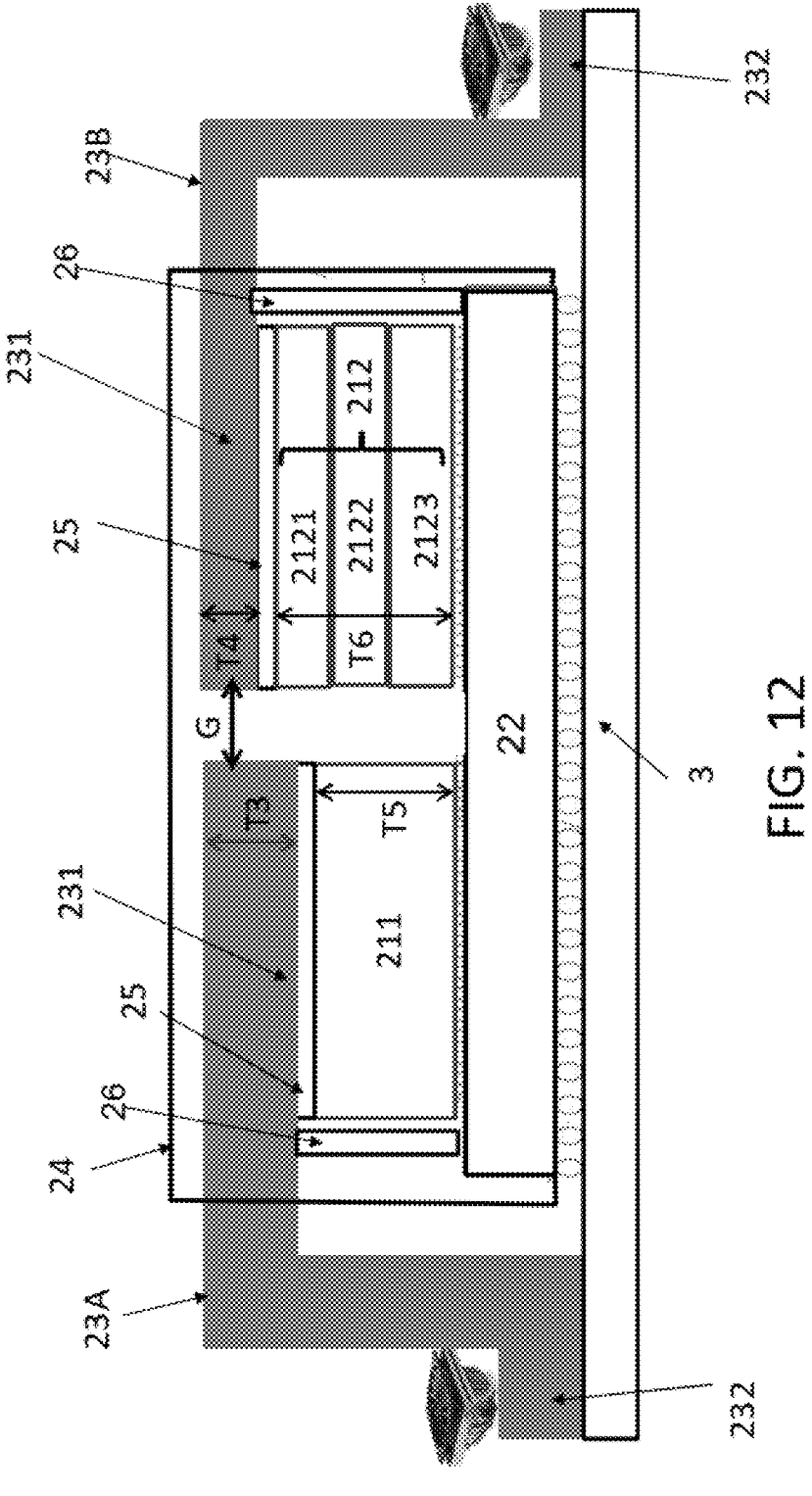

FIG. 12 is a diagram illustrating another embodiment of IC package according to the present invention.

Figure 13:
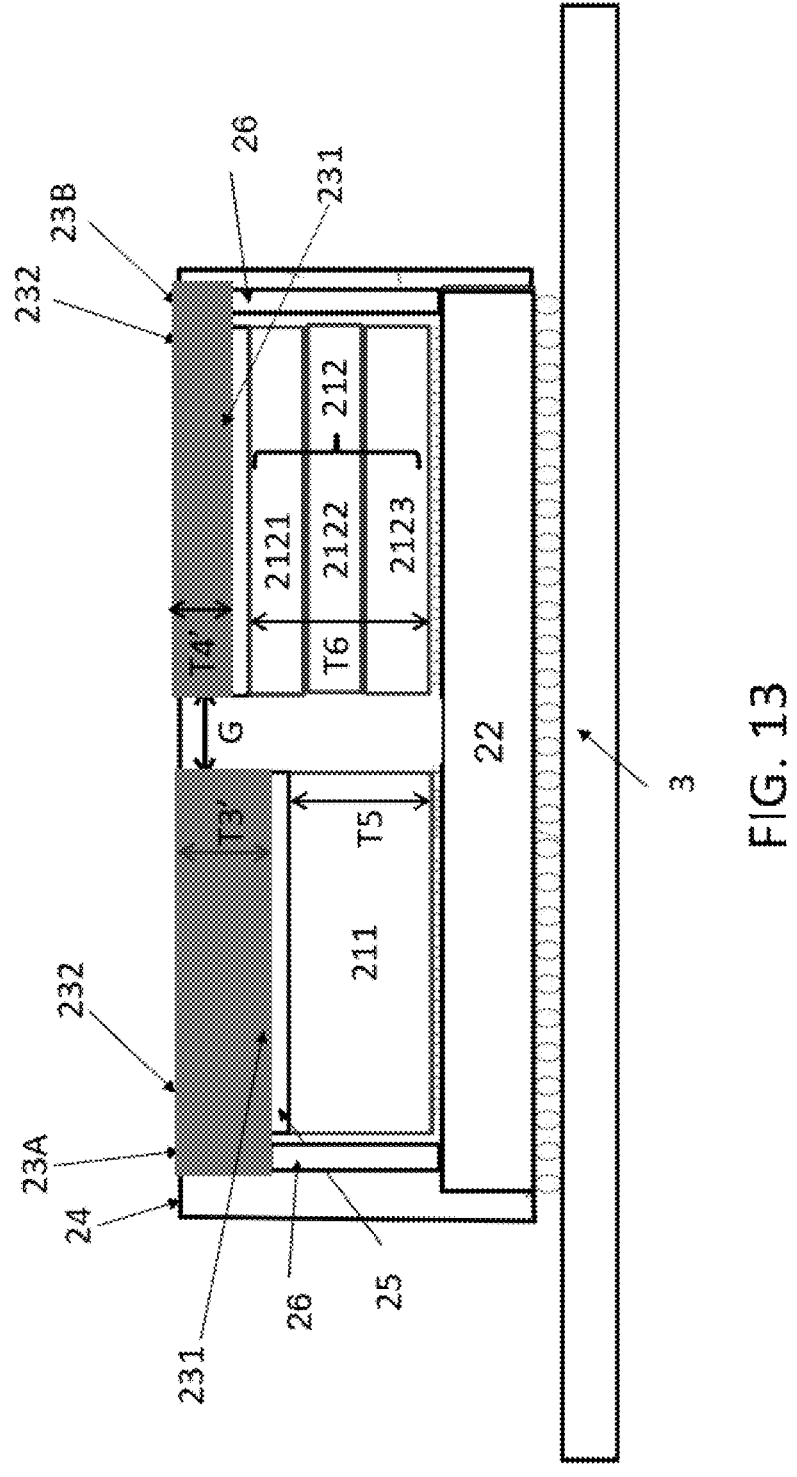

FIG. 13 is a diagram illustrating another embodiment of IC package according to the present invention.

Figure 14:
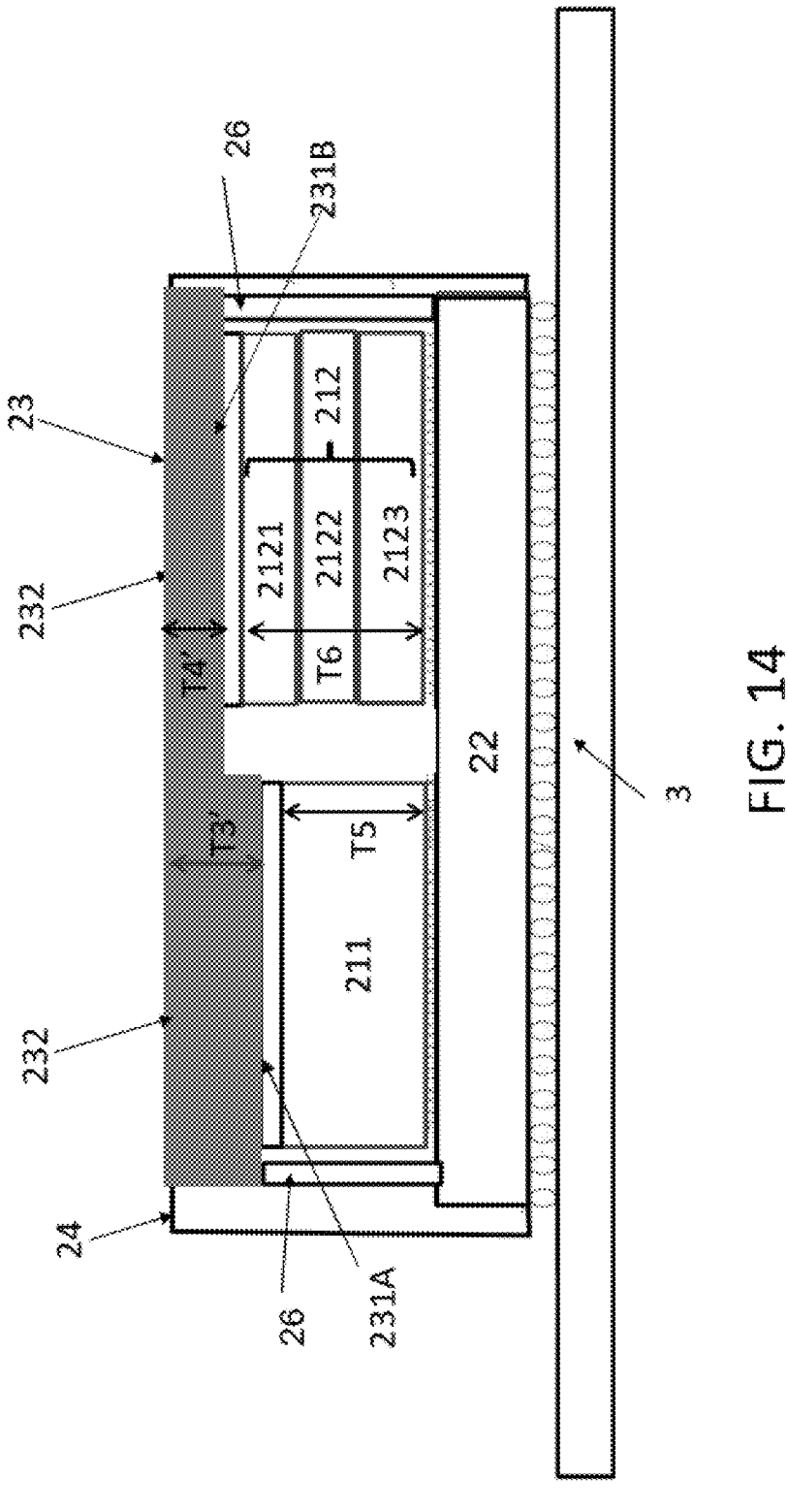

FIG. 14 is a diagram illustrating another embodiment of IC package according to the present invention.

DETAILED DESCRIPTION OF THE INVENTION

The above and other aspects of the disclosure will become better understood by the following detailed description of the preferred but non-limiting embodiment(s). The following description is made with reference to the accompanying drawings. Several embodiments of the present disclosure are disclosed below with reference to accompanying drawings. However, the structure and contents disclosed in the embodiments are for exemplary and explanatory purposes only, and the scope of protection of the present disclosure is not limited to the embodiments. It should be noted that the present disclosure does not illustrate all possible embodiments, and anyone skilled in the technology field of the disclosure will be able to make suitable modifications or changes based on the specification disclosed below to meet actual needs without breaching the spirit of the disclosure. The present disclosure is applicable to other implementations not disclosed in the specification.

Figure 1:
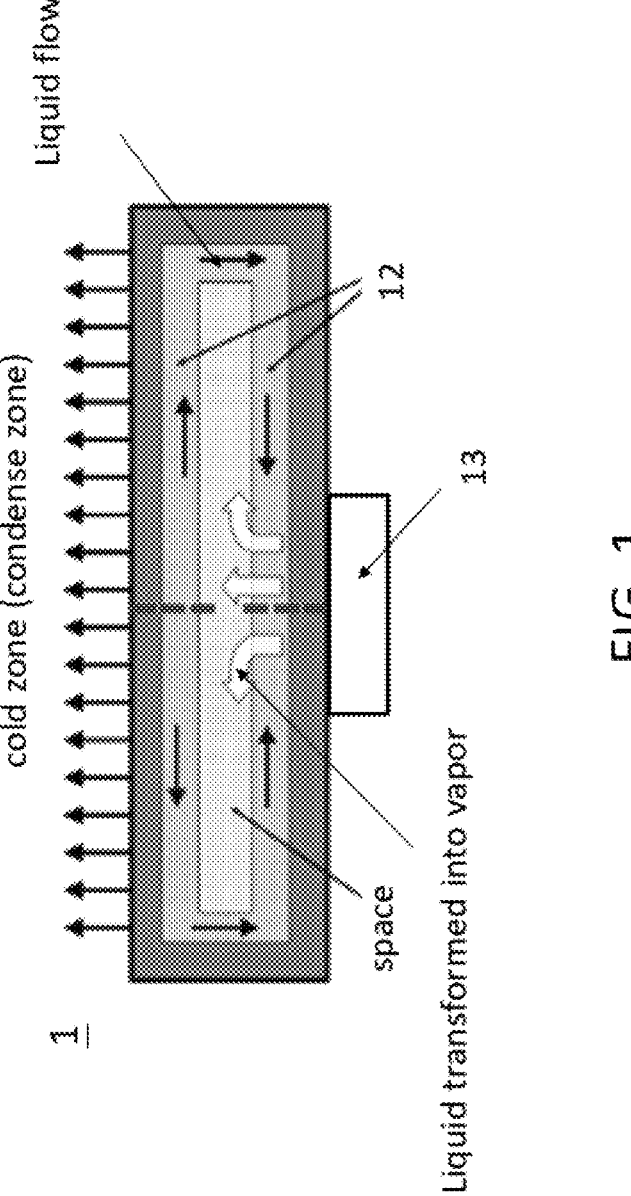
FIG. 1 shows an example of state-of-the-art vapor chamber.

Please refer to FIG. 1, there is capillary structure 12 covering inner wall(s) of the vapor chamber 1. A little liquid, such as water, is sealed in the vapor chamber. When a heat source 13 (such as IC chip) is attached to a portion of the vapor chamber (the portion of the vapor chamber 1 attached to the heat source 13 may be called as hot zone), the liquid will be changed into vapor or gas phase due to the heat generated by the heat source 13. Those vapors will be condensed into liquid again on the cold zone (the portion of the vapor chamber remote from the heat source) and flow back to the hot zone close to the heat source through the capillary structure 12.

Detailed description of the present invention is as follows. With special design of the vapor chamber, very thin vapor chamber (VTVC) could provide excellent thermal conductivity with thickness less than 1 mm, such as 0.3 mm~0.6 mm. For example, with suitable directional capillary structure design for liquid and enough space for the flow of vapor/gas, VTVC could have better thermal conductivity than diamond. The thermal conductivity (W/m·K) for diamond is around 2400~2500, but the thermal conductivity (W/m·K) for the 0.4 mm VTVC made of Copper, stainless steel, and Titanium are could be 4000~6000, 3700~5700 and 16000~24000, respectively, which is 2~10 times than diamond. Thus, VTVC could be implemented into IC package, especially for high performance computing system on chip (HPC-SOC) which dramatically generates huge heat. Moreover, Titanium has as much as 5-10× the specific strength and yield strength to similar structures comprised of copper with a much lower coefficient of thermal expansion than copper or aluminum. The enhanced mechanical strength of Ti enables the vapor chamber to be designed to function as a good thermal device.

Please refer to FIG. 2 which is one embodiment of IC package 2 according to the present invention, in which a semiconductor bare die (the die cut from the wafer) or monolithic IC chip 21 is stacked over a substrate 22 (such as ABF substrate) with solder balls or BGA balls 221. The bare die/monolithic IC chip 21 may include multiple solder bumps or copper pillars 210 electrically coupled to the substrate 22. A very thin vapor chamber 23 the thickness T1 of which is less than 1 mm (or 0.3 mm~0.8 mm, such as 0.4 mm, 0.5 mm, or 0.6 mm) is thermally coupled to the monolithic IC 21 through thermal interface material (TIM) or thermal adhesive layer 25. In one example, except the TIM or thermal adhesive layer 25, there is no other material between the very thin vapor chamber 23 and the monolithic IC 21. Moreover, it is better that the very thin vapor chamber 23 cover most or all top surface of the bare die/monolithic IC chip 21.

An encapsulating case 24, such as metal case, mechanical case or molding compound (usually made of epoxy resin, phenolic resin, or silica micro powder, etc.) then encapsulates or seals the bare die/monolithic IC chip 21, the substrate 22, and the very thin vapor chamber 23 together. When the encapsulating case 24 is made of molding compound, the material of molding compound will fill all space not occupied by the bare die/monolithic IC chip 21, the substrate 22, and the very thin vapor chamber 23. The solder balls or bump balls 221 of the substrate 22 are exposed out of the encapsulating case 24 to electrically couple to PCB board 3 or other circuit. Moreover, one portion (or one end portion) of the very thin vapor chamber 23 extends from the encapsulating case 24, and other portion (or other end portion) of the very thin vapor chamber 23 contacting the bare die/monolithic IC chip 21 through the TIM or thermal adhesive layer 25 is encapsulated or sealed within the encapsulating case 24.

Hereinafter, the portion of the very thin vapor chamber 23 contacting the bare die/monolithic IC chip 21 through the TIM or thermal adhesive layer 25 is called as proximal portion (or proximal end portion) 231, and the proximal end portion 231 is also a hot zone portion of the vapor chamber 23 since it contacts the bare die/monolithic IC chip 21 which generates the heat. On the other hand, the portion of the very thin vapor chamber 23 not encapsulated by the encapsulating case 24 is called as distal portion (or distal end portion) 232, and the distal end portion 232 is also a cold zone portion of the vapor chamber 23 since it is remote from the bare die/monolithic IC chip 21. There could exist round corners or curved corners 2331 in the transition portion 233 of the vapor chamber 23 between the proximal end portion 231 and the distal end portion 232. The vapor chamber 23 of the present invention could be made of Ti, stainless steel, copper, or copper alloy.

To avoid the overpressure against the bare die/monolithic IC chip 21 from the vapor chamber 23, in another embodiment a set of supporting pillars 26 could be provided under the vapor chamber 23. The set of supporting pillars 26 could be extended downward from the vapor chamber 23, or extended upward from the substrate 22. The height of each supporting pillar 26, in one embodiment, is greater than the height of the bare die/monolithic IC chip 21, such that when the set of supporting pillars 26 are disposed between the vapor chamber 23 and the substrate 22, there is enough gap between the vapor chamber 23 and the bare die/monolithic IC 21 to accommodate the TIM or thermal adhesive layer 25. Thus, the vapor chamber 23 will not over press the bare die/monolithic IC chip 21.

For efficient heat dissipation, a heat sink 31 could abut against the distal end portion 232 of the very thin vapor chamber 23, and a fan 32 could couple to the heat sink 31 to circulate the air for heat dissipation. It is possible to use TIM or thermal adhesive layer to attach the heat sink to the distal end portion 232, and the vapor chamber 23 could be fixed on the PCB board by a locker to avoid the vibration of the vapor chamber 23.

In another example, the heat sink 31 could include liquid pipes 311 coupled to the distal end portion 232 of the very thin vapor chamber 23, and a pump (not shown) could circulate the liquid within the liquid pipes to expedite the heat dissipation. Of course, in this example, the fan 32 could still couple to the heat sink 31 to circulate the air for heat dissipation.

In another embodiment, the whole IC package 2 and/or the distal end portion 232 of the very thin vapor chamber 23 could be immersed into the liquid 35 (such as dielectric liquid, organic compound, refrigerants, etc.) as shown in FIG. 2A to expedite the heat exchange. Thus, in this embodiment, the proximal end portion 231 within the encapsulating case 24 is not directly coupled to the liquid, but the distal end portion 232 out of the encapsulating case 24 is directly coupled to the liquid 35.

As previously mentioned, when the encapsulating case 24 is made of molding compound, the material of molding compound will fill all space not occupied by the bare die/monolithic IC chip 21, the substrate 22, and the very thin vapor chamber 23. Therefore, the wall of the encapsulating case 24 from which the vapor chamber 23 extends is also sealed and no liquid or gas will enter into the encapsulating case 24 made by molding compound. If necessary, the wall of the encapsulating case 24 from which the vapor chamber 23 extends could be further sealed with anti-water material (such as epoxy resin, phenolic resin) to prevent liquid or gas from entering into the encapsulating case 24 due to different thermal expansion coefficients between the molding compound and the vapor chamber 23.

When the encapsulating case 24 is made of metal or other mechanical structure, the wall of the encapsulating case 24 from which the vapor chamber 23 extends out of could be melt together with the vapor chamber 23, or the transition portion of the vapor chamber 23 between the proximal end portion and the distal end portion could be melt with the metal encapsulating case 24. On the other hand, the transition portion of the vapor chamber 23 and the metal encapsulating case 24 could be sealed by anti-water material (such as epoxy resin, phenolic resin), to prevent liquid or gas from entering into the encapsulating case 24.

Thus, the proximal end of the vapor chamber 23 thermally coupled to the semiconductor IC or bare die is within the metal encapsulating case 24, but the distal end of the vapor chamber 23 is out of the metal encapsulating case 24. The distal end of the vapor chamber 23 could be immersed into the liquid for thermal dissipation. In another embodiment, the semiconductor IC may be a well-package IC. That is, the metal encapsulating case 24 encapsulates the well-package IC and the vapor chamber 23, the proximal end of the vapor chamber 23 thermally couples to the well-package IC through the TIM or thermal adhesive material, and the distal end of the vapor chamber 23 out of the encapsulating case 24 is directly coupled to liquid.

Moreover, the vapor chamber 23 may cover most or all top surface of the monolithic IC 21. Since the vapor chamber 23 of the present invention could be made of Ti, stainless steel or copper, such metallic vapor chamber 23 covering most or all top surface of the monolithic IC 21 could play as a shielding case to reduce the electromagnetic waves generated by those ICs which may cause a malfunction of the monolithic IC 21 or other ICs. The vapor chamber 23 could be fixed on the PCB board by a locker which may be a conductor to electrically connect the vapor chamber 23 to a shielding ground area of the PCB board 3.

The vapor chamber 23, in one embodiment, has directional liquid flow between the cold zone portion (distal end portion 232) and the hot zone portion (proximal end portion 231). As shown in FIG. 3(a) which is a top and transparent view of the IC package 2 in FIG. 2, a plurality of isolating structures 234 are formed in the vapor chamber 23, and capillary structure 235 are formed within the vapor chamber 23 and outside (or among) the isolating structures 234. The distance d between two isolating structures 234 is 1 mm~2.5 mm, and the length c of the isolating structure 234 is around 10 d~20 d. Thus, when the evaporated gas from the hot zone portion is condensed to liquid at cold zone portion, the condensed liquid will directionally flow from the cold zone portion back to the hot zone portion along the capillary structure 235 at least between the isolating structures 234 (or between the isolating structure 234 and the boundary of the vapor chamber 23). Moreover, the isolating structures 234 could strengthen the mechanical structure of the vapor chamber 23, such that the encapsulating case 24 may not destroy, crash or distort the vapor chamber 23 the during the encapsulating process. The isolating structures 234 could at least exist right under (or penetrating through) the sidewall of the encapsulating case 24 from which the vapor chamber 23 extends, as shown in FIG. 3 (b).

In another example, the isolating structures 234 could further extend into most of the hot zone portion of the vapor chamber 23, as shown in FIG. 3-1(a). Furthermore, the vapor chamber 23 may include another set of isolating structures 234 close to edge(s) of the vapor chamber 23, as shown in FIG. 3-1(b), and in FIG. 3-1(b) at least ½ area of the hot zone portion is not penetrated or passed by the isolating structures 234.

FIG. 3-2(a) is a cross section view of the vapor chamber 23 along the cutline shown in FIG. 3(b). The vapor chamber 23 includes a top plate (or top portion) 237 and a lower plate (or lower portion) 238, the isolating structures 234 could be beam structures (or pillar/protrusion structures) extending upward from the lower portion 238. The vapor chamber 23 could further include supporting structures 236 corresponding to the isolating structures 234. The supporting structures 236 could connect the isolating structures 234 and provide additional supporting force for the vapor chamber 23, and the supporting structures 236 also create enough space for the flow of vapor/gas. The supporting structures 236 could be beam structures (or pillar/protrusion structures) extending downward from the top portion 237. In another embodiment shown in FIG. 3-2(b), the capillary structures 235 not only exist between the isolating structures 234 (and/or between the isolating structure 234 and the boundary of the vapor chamber 23), but also exist between the supporting structures 236 (and/or between the supporting structures 236 and the boundary of the vapor chamber 23). Therefore, it provides more liquid circulating paths.

The capillary structure of the present invention could be formed by a slurry through three heating processes of drying, cracking and sintering. The slurry contains a metal powder, a polymer and a solvent. The organic solvent may be an alcohol solvent, and the polymer may be a plastic polymer material, acrylic, synthetic fiber, nylon, natural resin, synthetic resin, or a combination thereof. The metal powder may comprise copper powder, copper oxide powder, cuprous oxide powder, tetracopper oxide powder, or a combination thereof. Powder sintering is carried out in a hydrogen-containing atmosphere, on the one hand to prevent oxidation of copper powder, and on the other hand to reduce copper oxide powder to copper.

FIG. 4 shows another embodiment of the present invention, and the major difference between FIG. 4 and FIG. 2 is that, the thickness T2 of the distal end portion 232 (or cold zone portion) is greater than or different from thickness T1 of the proximal end portion 231 (or the hot zone portion), wherein T2 is around 1 mm~10 mm and T1 is around 0.3 mm~0.8 mm (such as 0.4 mm or 0.5 mm).

For 2.5D IC structure or 3D IC structure, there are multiple chips/interposers stacked together and encapsulated within a casing or package, and the beat dissipation issue is severe. As shown in FIG. 5, there could be multiple semiconductor chips/bare dies (211, 212, and 213) stacked together in 3D IC structure, or in another example the bare die 212 in FIG. 5 is replaced by one interposer 300 such that and one interposer (300) is inserted between the semiconductor chips 211 and 213 in 2.5D IC structure. Those semiconductor chips and interposer are vertically stacked over the substrate 22. The semiconductor chips/bare dies and the interposer may include multiple through silicon vias (TSVs) or copper pillars electrically coupled to the substrate 22.

According to the present invention shown in FIG. 5 a very thin vapor chamber 23 the thickness of which is less than 1 mm (e.g., 0.2 mm~0.8 mm, such as 0.3 mm, 0.4 mm, 0.5 mm, or 0.6 mm) is thermally coupled to the most top semiconductor chip/bare die 213 through thermal interface material (TIM) or thermal adhesive layer 25. In one example, except the TIM or thermal adhesive layer 25, there is no other material between the very thin vapor chamber 23 and the most top semiconductor chip/bare die 213. An encapsulating case 24, such as metal case or molding compound (usually made of epoxy resin, phenolic resin, or silica micro powder, etc.) then encapsulates or seals the semiconductor chips/bare dies, the substrate 22, and the very thin vapor chamber 23 together. When the encapsulating case 24 is made of molding compound, the material of molding compound will fill all space not occupied by the semiconductor chips/bare dies (211, 212, and 213), the substrate 22, and the very thin vapor chamber 23.

To avoid the overpressure against the semiconductor chips/bare dies (211, 212, and 213) from the vapor chamber 23, in other embodiment a set of supporting pillars 26 could be provided under the vapor chamber 23. The set of supporting pillars 26 could be extended downward from the vapor chamber 23, or extended upward from the substrate 22. The height of each supporting pillar is a little bit larger than the sum of the heights of the semiconductor chips/bare dies (211, 212, and 213), such that when the set of supporting pillars 26 are disposed between the vapor chamber 23 and the substrate 22, there is enough gap (0.01 mm 0.1 mm) between the vapor chamber 23 and the semiconductor chips/bare dies to accommodate the TIM or thermal adhesive layer 25. Thus, the vapor chamber 23 will not over press the semiconductor chips/bare dies (211, 212, and 213).

Moreover, there could be two or more end portion of the very thin vapor chamber 23 (cold zone portions or distal portions 232) extends from the encapsulating case 24, and there is one portion of the very thin vapor chamber 23 (hot zone portion or proximal portion 231) contacting the semiconductor chip/bare die 213 through the TIM or thermal adhesive layer 25, and the hot zone portion or proximal portion 231 is encapsulated or sealed by the encapsulating case 24. There could exist round corners or curved corners in the transition portion 233 of the vapor chamber 23 between the proximal end portion 231 and the distal end portion 232. The vapor chamber 23 of the present invention could be made of Ti, stainless steel or copper.

Heat sinks 31 could abut against the distal portions 232 of the very thin vapor chamber 23, and the fan 32 could couple to the heat sink 31 to circulate the air for heat dissipation. TIM or thermal adhesive layer could be used to attach the heat sink to each distal portion 232, and moreover the vapor chamber 23 could be fixed on the PCB board at each distal portion 232 by a locker to avoid the vibration of the vapor chamber 23. In another example, the heat sink 31 could include liquid pipes coupled to the distal portion 232 of the very thin vapor chamber 23, and a pump (not shown) could circulate the liquid within the liquid pipes to expedite the heat dissipation.

Similarly, the whole IC package in FIG. 5 or the distal end portions 232 of the very thin vapor chamber 23 could be immersed into the liquid (such as dielectric liquid, organic compound, refrigerants, etc.) to expedite the heat exchange. Thus, in this embodiment, the proximal portion 231 within the encapsulating case 24 is not directly coupled to the liquid, but the distal portions 232 out of the encapsulating case 24 are directly coupled to the liquid.

When the encapsulating case 24 is made of molding compound, the material of molding compound will fill all space not occupied by the semiconductor chips/bare dies and the interposer (211, 212, and 213), the substrate 22, and the very thin vapor chamber 23. Therefore, the walls of the encapsulating case 24 from which the vapor chamber 23 extends or protrudes are also sealed and no liquid or gas will enter into the encapsulating case 24 made by molding compound. When the encapsulating case 24 is made of metal or other mechanical structure, the wall of the encapsulating case 24 from which the vapor chamber 23 extends out of could be melt together with the vapor chamber 23, or the transition portion of the vapor chamber 23 between the proximal end portion and the distal end portion could be melt with the metal encapsulating case 24. On the other hand, the transition portion of the vapor chamber 23 and the metal encapsulating case 24 could be sealed by anti-water material (such as epoxy resin, phenolic resin), to prevent liquid or gas from entering into the encapsulating case 24.

Moreover, the vapor chamber 23 may cover most or all top surface (and/or even sidewalls) of the semiconductor chips/bare dies and interposer. Since the vapor chamber 23 of the present invention could be made of Ti, stainless steel or copper, such metallic vapor chamber 23 covering most of the semiconductor chips/bare dies and interposer could play as a shielding case to reduce the electromagnetic waves generated by those semiconductor chips/bare dies and/or interposer. The vapor chamber 23 could be fixed on the PCB board by a locker which may be a conductor to electrically connect the vapor chamber 23 to a shielding ground area of the PCB board.

FIG. 6 is one exemplary top and transparent view of the FIG. 5, and the vapor chamber 23 has directional liquid flow from the two or more cold zone portions (distal portions 232) to the hot zone portion (proximal portion 231). As shown in the bottom picture of FIG. 6, two or more sets of isolating structures 234 are formed within the vapor chamber 23, and capillary structure 235 are formed outside or between the isolating structures 234. When the evaporated gas from the hot zone portion is condensed to liquid at two or more cold zone portions, the condensed liquid will directionally flow from the cold zone portions back to the hot zone portion along the capillary structure 235. Moreover, the isolating structures 234 could strengthen the mechanical structure of the vapor chamber 23, such that the encapsulating case 24 may not destroy, crash or distort the vapor chamber 23 the during the encapsulating process. It is better to have the isolating structures 234 existing right under (or penetrating through) the walls of the encapsulating case 24 from which the vapor chamber 23 extends, as shown in the bottom transparent picture of FIG. 6.

FIG. 7 is another exemplary top and transparent view of the FIG. 5, and the vapor chamber 23 has directional liquid flow from the two or more cold zone portions (distal portions 232) to the hot zone portion (proximal portion 231). The major differences between FIG. 6 and FIG. 7 are:

(1) The area (or width W2) of each cold zone portion (distal portion 232) is greater than or different from the area (or width W1) of the hot zone portion (proximal portion 231) within the encapsulating case 24;

(2) The distance d1 between two isolating structures 234 located close to the hot zone portion (proximal portion 231) is shorter than or different from the distance d2 (such as, <2.5 mm) between two isolating structures 234 located close to the cold zone portion (proximal portion 232).

When the evaporated gas from the hot zone portion is condensed to liquid at two or more cold zone portions, the condensed liquid will directional flow from each cold zone portion back to the hot zone portion along the capillary structure 235. Since there are two or more cold zone portions, the heat dissipation will be increased. Moreover, two or more sets of isolating structures 234 could strengthen the mechanical structure of the vapor chamber 23, such that the encapsulating case 24 may not destroy, crash or distort the vapor chamber 23 the during the encapsulating process.

Although FIG. 6 and FIG. 7 just show two cold zone portions (distal portions 232) in one vapor chamber 23, in another embodiment one vapor chamber 23 could have directional liquid flow from more than two, such as four, cold zone portions (distal portions 232) to the hot zone portion (proximal portion 231) which is within the encapsulating case 24. That is, the vapor chamber 23 extends the encapsulating case 24 not only from left and right directions, but also from the up and down directions. The vapor chamber 23 could cover all top surface and even four sidewalls of the semiconductor chips/bare dies and interposer (211, 212, and 213), thus it may play as a better shielding case to reduce the electromagnetic waves generated by those semiconductor chips/bare dies and/or interposer.

FIG. 8 shows another embodiment of IC package with multiple very thin vapor chambers according to the present invention. The difference between FIG. 5 and FIG. 8 is that, there are two or more very thin vapor chambers 23 covering the top surface of the semiconductor chip/bare die 213. There is a gap G between two separate very thin vapor chambers 23 along the top surface of the semiconductor chip/bare die 213, and the gap could be filled with TIM or thermal adhesive layer 25 (or the material of the molding compound). It is better to reduce the gap G as small as possible (such as less than 1 mm), such that most of the top surface of the semiconductor chip/bare die 213 could be covered by the two separate very thin vapor chambers 23, and heat generated from the semiconductor chip/bare die 213 (or the semiconductor chips/bare dies and interposer 211, 212, and 213) could be separately dissipated by the two very thin vapor chambers 23. Of course, multiple very thin vapor chambers (two or even more) in FIG. 8 could be applied to single chip/die as well, rather than only applied to stacked dies structure in FIG. 8.

The cold zone portion of each vapor chambers 23 could be coupled to one heat sink 31 which is then coupled to a fan 32, and each vapor chambers 23 could be fixed to the PCB board 3 by a locker. Alternatively, the cold zone portion of each vapor chambers 23 could be immersed into liquid (such as dielectric liquid, organic compound, refrigerants, etc.) to expedite the heat exchange. FIG. 9 is one exemplary top and transparent view of the FIG. 8, and each vapor chamber 23 has directional liquid flows from the cold zone portion (or distal portion 232) to the hot zone portion (or proximal portion 231).

Two or more separate vapor chambers structure in FIG. 8 could be applied to another IC package in which two or more semiconductor chip/bare die 211 and 212 are laterally spaced apart and disposed over the substrate 22, as shown in FIG. 10. The left vapor chambers 23 in FIG. 10 covers most or all top surface of the left semiconductor chip/bare die 211, and the heat generated by the left semiconductor chip/bare die 211 will be dissipated from the hot zone portion of the left vapor chambers 23 to the cold zone portion of the left vapor chambers 23 (also refer to left portion of FIG. 11, FIG. 11 is a top and transparent view of FIG. 10). Moreover, the right vapor chambers 23 in FIG. 10 covers most or all top surface of the right semiconductor chip/bare die 212, and the heat generated by the right semiconductor chip/bare die 212 will be dissipated from the hot zone portion of the right vapor chambers 23 to the cold zone portion of the right vapor chambers 23 (also refer to right portion of FIG. 11). The gap G (such as >1 mm) between two separate very thin vapor chambers 23 in FIG. 10 could be larger than that in FIG. 8, since most or all top surface of each semiconductor chip/bare die 212 is already covered by one independent vapor chamber 23. In another embodiment, the semiconductor chip may be a well-package IC. The encapsulating case 24 made of metal encapsulates those well-package ICs and the vapor chamber 23, the proximal end of each vapor chamber 23 within the metal encapsulating case 24 thermally couples to the well-package IC through the TIM or thermal adhesive material, and the distal end of each vapor chamber 23 out of the encapsulating case 24 is directly coupled to liquid.

Two or more separate vapor chambers structure in FIG. 8 could be applied to another IC package, as shown in FIG. 12. In FIG. 12, the left semiconductor chip/bare die 211 has a thickness of T5, and the right semiconductor chips/bare dies 212 (including multiple dies 2121, 2122, and 2123) has a total thickness of T6, wherein T6>T5. In this embodiment, the left semiconductor chip/bare die 211 could be a multiple cores processor, and the right semiconductor chips/bare dies 212 could be stacked chips or HBM including multiple memory chips/dies vertically stacked together.

The heat generated by the left semiconductor chip/bare die 211 will be dissipated from the hot zone portion 231 of the left vapor chambers 23A to the cold zone portion 232 of the left vapor chambers 23A, and the thickness of the left vapor chambers 23A, especially the thickness of the hot zone portion 231, is T3 (<1 mm, such as 0.6 mm). The heat generated by the right semiconductor chips/bare dies 212 (including multiple dies 2121, 2122, and 2123) will be dissipated from the hot zone portion 231 of the right vapor chambers 23B to the cold zone portion 232 of the right vapor chambers 23B, and the thickness of the right vapor chambers 23B, especially the thickness of the hot zone portion 231, is T4 (<1 mm, such as 0.3 mm~0.4 mm). It is better that (T3+T5) is substantially the same as (T4+T6), thus, T3>T4.

That is, different vapor chamber in the encapsulating case 24 could have different thickness.

Optionally, supporting pillars 26 could be provided under the vapor chamber 23A and 23B in FIG. 12. The height of the left supporting pillar 26 in FIG. 12 is a little bit higher than the height (T5) of the semiconductor chip/bare die 211, such that when the left supporting pillar 26 are disposed between the left vapor chamber 23A and the substrate 22, there is enough gap (such as 0.1 mm~0.01 mm) between the left vapor chamber 23A and the semiconductor chip/bare die 211 to accommodate the TIM or thermal adhesive layer 25. Thus, the vapor chamber 23A will not over press the semiconductor chip/bare die 211. Similarly, The height of the right supporting pillar 26 in FIG. 12 is a little bit higher than the height (T6) of the semiconductor chips/bare dies 212 (including multiple dies 2121, 2122, and 2123), such that when the right supporting pillar 26 are disposed between the right vapor chamber 23B and the substrate 22, there is enough gap (such as 0.1 mm~0.01 mm) between the right vapor chamber 23B and the semiconductor chips/bare dies 212 to accommodate the TIM or thermal adhesive layer 25.

FIG. 13 illustrates another embodiment of the present invention, and the major difference between FIG. 13 and FIG. 12 is that, the vapor chamber 23A and 23B extend upward and reveal their cold zone portions (or distal portion 232) not covered by the encapsulating case 24, but the lateral ends of the vapor chamber 23A and 23B are encapsulated by the encapsulating case 24. In this embodiment, the top surface of the vapor chamber 23A is the cold zone portion (or distal portion 232) and the bottom surface of the vapor chamber 23A is the hot zone portion (or proximal portion 231), so is the vapor chamber 23B. The distance between the proximal portion 231 and the distal portion 232 of the vapor chamber 23A is T3', and the distance between the proximal portion 231 and the distal portion 232 of the vapor chamber 23B is T4'. Since T6>T5, it is better that (T6+T4') is the same or substantially the same as (T5+T3'), thus, T3'>T4'.

The top surface of the vapor chamber 23A (and/or 23B) could be aligned with the top surface of the encapsulating case 24, or the top surface of the vapor chamber 23A (and/or 23B) could extends or protrudes from the top surface of the encapsulating case 24. Thus, the top surface of the vapor chamber 23A (and/or 23B) could be higher than the top surface of the encapsulating case 24. The revealed cold zone portions of the vapor chamber 23A (and/or 23B) could be thermally coupled to heat sink (with or without liquid pipe) or directly immersed into liquid, as previously described. In another embodiment, the semiconductor chip may be a well-package IC. The encapsulating case 24 made of metal encapsulates those well-package ICs and the vapor chamber 23, the proximal end of each vapor chamber within the metal encapsulating case 24 thermally couples to the well-package IC through the TIM or thermal adhesive material, and the distal end of each vapor chamber 23 out of the encapsulating case 24 is directly coupled to liquid.

FIG. 14 illustrates another embodiment of the present invention, and the major difference between FIG. 14 and FIG. 13 is that, there is a single vapor chamber 23 covering both the semiconductor chip/bare die 211 and the semiconductor chip/bare die 212. The vapor chamber 23 has a distal portion 232, a proximal portion 231A and another proximal portion 231B. The proximal portion 231A covers the semiconductor chip/bare die 211, and the another proximal portion 231B covers the semiconductor chip/bare die 212.

The single vapor chamber 23 includes a first portion with a thickness T3' (that is, the distance between the distal portion 232 and the proximal portion 231A) covering the semiconductor chip/bare die 211 and a second portion with a thickness T4' (that is, the distance between the distal portion 232 and the another proximal portion 231B) covering the semiconductor chip/bare die 212. Wherein, T3' (<1 mm, such as 0.6 mm~0.8 mm) is not equal to T4' (<1 mm, such as 0.3 mm~0.5 mm).

Of course, no matter in FIG. 13 or FIG. 14, it is also possible that the lateral end of each vapor chamber 23 extends or protrudes from the encapsulating case 24, just like the structure in FIG. 12. Furthermore, in FIG. 13 or FIG. 14, it is also possible that the top surface of each vapor chambers 23 is still covered by the encapsulating case 24.

Although the present invention has been illustrated and described with reference to the embodiments, it is to be understood that the invention is not to be limited to the disclosed embodiments, but on the contrary, is intended to cover various modifications and equivalent arrangements included within the spirit and scope of the appended claims.

What is claimed is:

1. An IC package, comprising:
a substrate; a semiconductor die with a top surface, the semiconductor die stacked over the substrate; a vapor chamber stacked over the semiconductor die, wherein the vapor chamber comprises a proximal portion and a distal portion, the proximal portion covers the top surface of the semiconductor die; and an encapsulating case at least encapsulating the semiconductor die and the vapor chamber, wherein the proximal portion of the vapor chamber is within the encapsulating case, and the distal portion of the vapor chamber extends out of the encapsulating case from an external wall of the encapsulating case, the proximal portion of the vapor chamber is sealed within the encapsulating case, and the distal portion of the vapor chamber is not sealed within the encapsulating case; wherein the encapsulating case is made of molding compound material, the proximal portion of the vapor chamber is sealed by the molding compound material, and there is no molding compound material between the vapor chamber and the semiconductor die, and on the distal portion.

2. The IC package in claim 1, wherein the vapor chamber is a thin vapor chamber with a thickness of 0.3~0.6 mm.

3. The IC package in claim 1, wherein the vapor chamber is a thin vapor chamber with a thickness less than 1 mm.

4. The IC package in claim 3, wherein the proximal portion covers the top surface of the semiconductor die, and the vapor chamber is stacked over the semiconductor die through a TIM or thermal adhesive layer.

5. The IC package in claim 4, wherein a supporting pillar is between the vapor chamber and the substrate, and a height of the supporting pillar is larger than that of the semiconductor die.

6. The IC package in claim 1, wherein the vapor chamber comprises:
a set of isolating structures formed in the vapor chamber; and
a capillary structure formed in the vapor chamber and disposed between the set of isolating structures.

7. The IC package in claim 6, wherein the set of isolating structures extend along a direction from the distal portion to the proximal portion, and the set of isolating structures penetrates through the wall of the encapsulating case.

8. The IC package in claim 6, wherein the vapor chamber further comprises a set of supporting structures in the vapor chamber and connected to the set of isolating structures, wherein the set of supporting structures extend downward from a top side of the vapor chamber and the set of isolating structures extend upward from a bottom side of the vapor chamber, and another capillary structure is disposed between the set of supporting structures.

9. The IC package in claim 1, wherein the distal portion of the vapor chamber is thermally coupled to a heat sink, wherein the heat sink or the liquid is located outside the encapsulating case.

10. The IC package in claim 1, wherein a width of the distal portion is larger than that of the proximal portion.

11. The IC package in claim 1, wherein a thickness of the distal portion is larger than that of the proximal portion.

12. An IC package, comprising: a first semiconductor chip with a top surface; a first vapor chamber stacked over the first semiconductor chip, wherein the first vapor chamber comprises a proximal portion and a distal portion, the proximal portion covers the top surface of the first semiconductor chip, and a thickness of the proximal portion is less than 1 mm; and a molding compound encapsulating the first semiconductor chip and the first vapor chamber, wherein the proximal portion of the first vapor chamber is sealed within the molding compound, and the distal portion of the first vapor chamber protrudes outside of the molding compound from an external wall of the molding compound, without molding compound on the distal portion.

13. The IC package in claim 12, wherein a thickness of the proximal portion is between 0.2~0.8 mm.

14. The IC package in claim 12, wherein the first vapor chamber further comprises another distal portion protruding from another wall of the molding compound, and the proximal portion is between the distal portion and the another distal portion.

15. The IC package in claim 12, further comprising:
a second vapor chamber physically spaced apart from the first vapor chamber and stacked over the second semiconductor chip, wherein the second vapor chamber is encapsulated by the molding compound;
wherein the second vapor chamber comprises a proximal portion and a distal portion, the proximal portion of the second vapor chamber covers the top surface of the second semiconductor chip, and a thickness of the proximal portion of the second vapor chamber is less than 1 mm, and the distal portion of the second vapor chamber protrudes from another wall of the molding compound.

16. An IC package, comprising: a substrate; a first semiconductor IC with a top surface, the first semiconductor IC stacked above the substrate; a first vapor chamber, wherein the first vapor chamber comprises a proximal portion and a distal portion, the proximal portion is thermally coupled to the top surface of the first semiconductor IC; and a molding compound encapsulating the first semiconductor IC and the first vapor chamber, wherein the proximal portion of the first vapor chamber is encapsulated within the molding compound, and the distal portion of the first vapor chamber protrudes outside of the molding compound from an external wall of the molding compound, without the molding compound on the distal portion; wherein the distal portion of the first vapor chamber is thermally coupled to a heat sink or a liquid pipe, wherein the heat sink or the liquid pipe is located outside the molding compound.

17. The IC package in claim 16, further comprising:
a second semiconductor IC with a top surface, the second semiconductor IC horizontally spaced apart from the first semiconductor IC and stacked above the substrate, wherein the second semiconductor IC is encapsulated by the molding compound.

18. An IC package comprising:
a substrate; a semiconductor die with a top surface, the semiconductor die stacked over the substrate; a vapor chamber stacked over the semiconductor die, wherein the vapor chamber comprises a proximal portion and a distal portion, the proximal portion covers the top surface of the semiconductor die; and a molding compound at least encapsulating the semiconductor die and the vapor chamber, wherein the proximal portion of the vapor chamber is within the molding compound, and the distal portion of the vapor chamber extends out of a wall of the molding compound, the proximal portion of the vapor chamber is sealed within the molding compound, and the distal portion of the vapor chamber is not sealed within the molding compound, without the molding compound on the distal portion; and another vapor chamber physically spaced apart from the vapor chamber and stacked over a second semiconductor chip; wherein the another vapor chamber comprises a proximal portion and a distal portion, the proximal portion of the other vapor chamber covers the top surface of the second semiconductor chip, and the distal portion of the other vapor chamber extends out of another wall of the molding compound, without the molding compound on the distal portion.

19. An IC package, comprising: a substrate; a semiconductor die with a top surface, the semiconductor die stacked over the substrate; a vapor chamber stacked over the semiconductor die, wherein the vapor chamber comprises a proximal portion and a distal portion, the proximal portion covers the top surface of the semiconductor die; and a molding compound at least encapsulating the semiconductor die and the vapor chamber, wherein the proximal portion of the vapor chamber is within the molding compound, and the distal portion of the vapor chamber extends out of a wall of the molding compound, the proximal portion of the vapor chamber is sealed within the molding compound, and the distal portion of the vapor chamber is not sealed within the encapsulating ease-molding compound, without the molding compound on the distal portion.

* * * * *